US010950495B2

(12) United States Patent
Ting et al.

(10) Patent No.: US 10,950,495 B2
(45) Date of Patent: Mar. 16, 2021

(54) MITIGATING PATTERN COLLAPSE

(71) Applicant: TAIWAN SEMICONDUCTOR MANUFACTURING COMPANY LIMITED, Hsin-Chu (TW)

(72) Inventors: Chih-Yuan Ting, Taipei (TW); Ya-Lien Lee, Baoshan Township (TW); Chung-Wen Wu, Zhubei (TW); Jeng-Shiou Chen, Kaohsiung (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/053,841

(22) Filed: Aug. 3, 2018

(65) Prior Publication Data

US 2018/0342418 A1 Nov. 29, 2018

Related U.S. Application Data

(62) Division of application No. 13/744,485, filed on Jan. 18, 2013, now Pat. No. 10,043,706.

(51) Int. Cl.
*H01L 21/76* (2006.01)
*H01L 21/768* (2006.01)
(Continued)

(52) U.S. Cl.
CPC .. *H01L 21/76838* (2013.01); *H01L 21/76844* (2013.01); *H01L 21/76867* (2013.01);
(Continued)

(58) Field of Classification Search
USPC ....... 438/653, 675, 666, 620, 623, 636–638, 438/724, 786; 257/774, 738, 758, 751, (Continued)

(56) References Cited

U.S. PATENT DOCUMENTS

2007/0111508 A1 5/2007 Hayashi et al.
2008/0182405 A1* 7/2008 Liu .................. H01L 21/76826
438/623
(Continued)

FOREIGN PATENT DOCUMENTS

JP 2001-338978 A 7/2001
JP 2006-294979 A 10/2006
KR 1020000008401 A 2/2000

OTHER PUBLICATIONS

Korean Office Action cited in Korean Application No. 10-2013-0044707 dated Feb. 24, 2014 (9pgs).
(Continued)

*Primary Examiner* — Moin M Rahman
(74) *Attorney, Agent, or Firm* — Cooper Legal Group, LLC

(57) ABSTRACT

One or more techniques or systems for mitigating pattern collapse are provided herein. For example, a semiconductor structure for mitigating pattern collapse is formed. In some embodiments, the semiconductor structure includes an extreme low-k (ELK) dielectric region associated with a via or a metal line. For example, a first metal line portion and a second metal line portion are associated with a first lateral location and a second lateral location, respectively. In some embodiments, the first portion is formed based on a first stage of patterning and the second portion is formed based on a second stage of patterning. In this manner, pattern collapse associated with the semiconductor structure is mitigated, for example.

20 Claims, 18 Drawing Sheets

(51) Int. Cl.
    *H01L 23/528*     (2006.01)
    *H01L 23/522*     (2006.01)
    *H01L 23/532*     (2006.01)

(52) U.S. Cl.
    CPC ...... *H01L 23/5226* (2013.01); *H01L 23/5283* (2013.01); *H01L 23/53295* (2013.01); *H01L 2924/0002* (2013.01)

(58) Field of Classification Search
    USPC ........ 257/503, 741, 773, 762, 734, 759, 753
    See application file for complete search history.

(56) References Cited

U.S. PATENT DOCUMENTS

| | | | |
|---|---|---|---|
| 2008/0191352 A1* | 8/2008 | Yu ..................... | H01L 21/76808 257/751 |
| 2009/0115061 A1* | 5/2009 | Chen ................. | H01L 21/76835 257/751 |
| 2010/0055897 A1* | 3/2010 | Chou ................... | C11D 3/3947 438/638 |
| 2010/0078820 A1* | 4/2010 | Kurokawa ........ | H01L 21/76843 257/751 |
| 2010/0327446 A1* | 12/2010 | Yang ................. | H01L 21/76846 257/751 |
| 2014/0027822 A1* | 1/2014 | Su ....................... | H01L 29/4966 257/288 |

OTHER PUBLICATIONS

Korean Patent Office Notice of Allowance in Korean Application 10-2013-0044707 dated May 20, 2014 (3pgs).

\* cited by examiner

MITIGATING PATTERN COLLAPSE

RELATED APPLICATION

This application is a divisional of and claims priority to U.S. patent application Ser. No. 13/744,485, titled "MITIGATING PATTERN COLLAPSE" and filed on Jan. 18, 2013, which is incorporated herein by reference.

BACKGROUND

Generally, a trench is etched in a region to form a space for a metal line. However, when the trench is deep, complications may occur during fabrication. For example, one or more trenches often collapse, thus resulting in pattern collapse associated with the region.

BRIEF DESCRIPTION OF THE DRAWINGS

Aspects of the disclosure are understood from the following detailed description when read with the accompanying drawings. It will be appreciated that elements, structures, etc. of the drawings are not necessarily drawn to scale. Accordingly, the dimensions of the same may be arbitrarily increased or reduced for clarity of discussion, for example.

DETAILED DESCRIPTION

Figure 1:
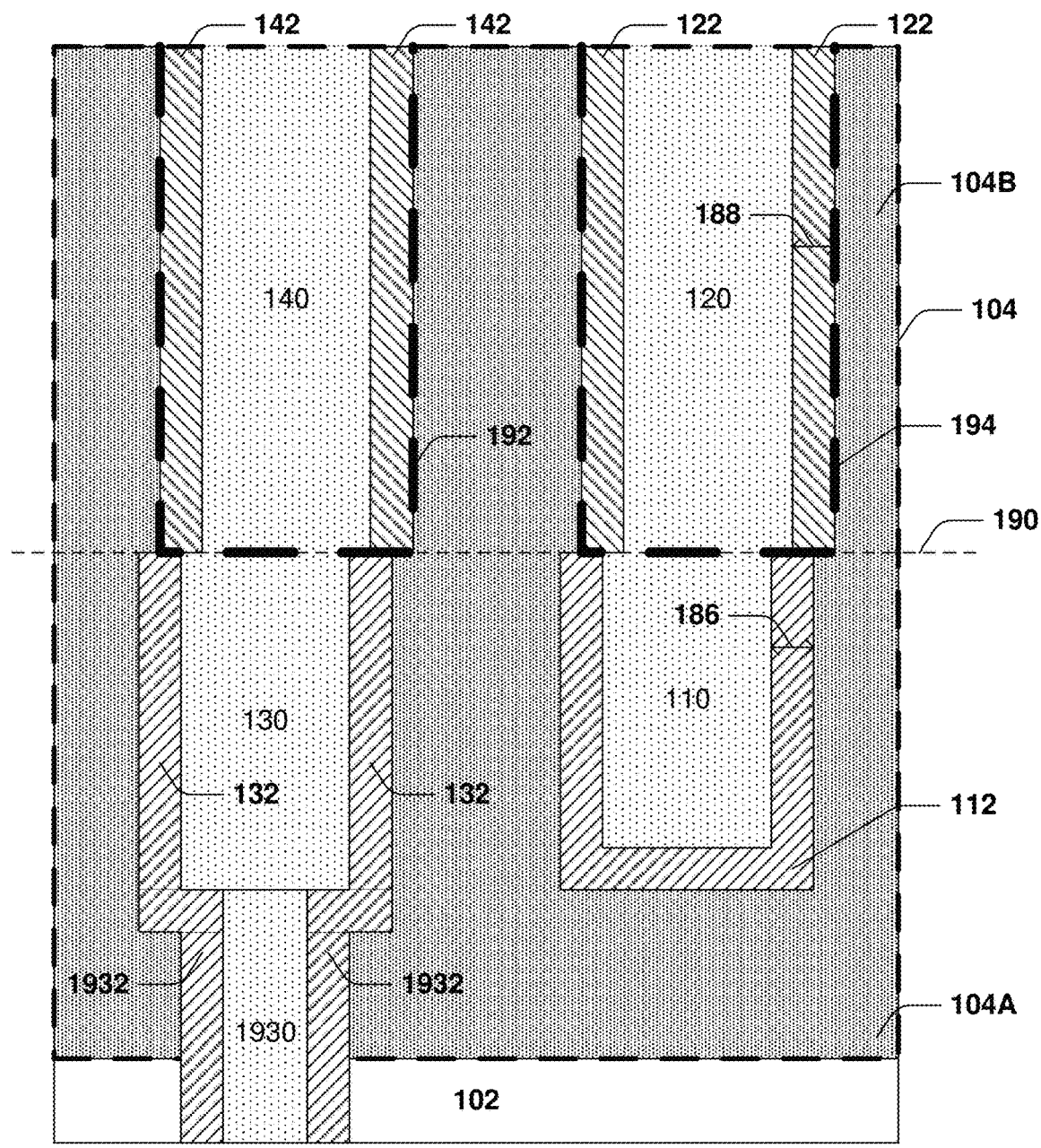
FIG. 1 is a cross-sectional view of an example semiconductor structure for mitigating pattern collapse, according to some embodiments.

Embodiments or examples, illustrated in the drawings are disclosed below using specific language. It will nevertheless be understood that the embodiments or examples are not intended to be limiting. Any alterations and modifications in the disclosed embodiments, and any further applications of the principles disclosed in this document are contemplated as would normally occur to one of ordinary skill in the pertinent art.

It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

It will be appreciated that for at least some of the figures herein, one or more boundaries, such as boundary 104 of FIG. 1, for example, are drawn with different heights, widths, perimeters, aspect ratios, etc. relative to one another merely for illustrative purposes, and are not necessarily drawn to scale. For example, because dashed or dotted lines are used to represent different boundaries, if the dashed and dotted lines were drawn on top of one another they would not be distinguishable in the figures, and thus are drawn slightly apart from one another, in at least some of the figures, so that they are distinguishable from one another, for example. As another example, because a region is associated with an irregular shape, a box drawn with a dashed line, dotted lined, etc. does not necessarily encompass an entire region. Similarly, a drawn box does not necessarily encompass merely the associated region, but encompasses at least some of one or more other region as well, in some embodiments. Accordingly, dimensions of some of these boundaries are drawn taller, shorter, wider, narrower, etc. than needed in some embodiments so that the different boundaries are visible in the figures, for example.

The following figures illustrate formation of an example semiconductor structure during semiconductor fabrication, according to some embodiments. It will be appreciated that at least some of the respective figures are described with reference to one another, such as with reference to a previous figure, for example. However, at least some of the respective figures are not described with reference to the previous figure. For example, according to some embodiments, FIG. 15 is not described with reference to FIG. 14.

FIG. 1 is a cross-sectional view 100 of an example semiconductor structure for mitigating pattern collapse, according to some embodiments. In some embodiments, the semiconductor structure of FIG. 1 comprises a first etch stop layer (ESL) 102. Additionally, the semiconductor structure comprises an extreme low-k (ELK) dielectric region 104. In some embodiments, the ELK dielectric region 104 comprises a first ELK dielectric region 104A and a second ELK dielectric region 104B. In some embodiments, the first ELK dielectric region 104A is above at least some of the first ESL 102. In some embodiments, the second ELK dielectric region 104B is above at least some of the first ELK dielectric region 104A. For example, the second ELK dielectric region 104B is above boundary 190. In some embodiments, at least some of at least one of the ELK dielectric region 104, the first ELK dielectric region 104A, or the second ELK dielectric region 104B comprises at least one of a metal line, or an additional metal line associated with a via.

For example, the metal line comprises a first metal line portion 110 and a second metal line portion 120. In some embodiments, the first metal line portion 110 is associated with a first lateral metal line location and the second metal line portion 120 is associated with a second lateral metal line location. Additionally, an additional metal line comprises a first metal line portion 130 and a second metal line portion 140. In some embodiments, the additional metal line is associated with a via portion 1930. In some embodiments, the first metal line portion 130 is associated with a first lateral location and the second metal line portion 140 is associated with a second lateral location. In some embodiments, the via portion 1930 is associated with the first lateral location. In some embodiments, the second lateral metal line location is different from the first lateral metal line location. In some embodiments, the second lateral location is different from the first lateral location. In some embodiments, at least one of the first metal line portion 130, the first metal line portion 110, or the via portion 1930 is formed based on a first stage of patterning. In some embodiments, at least one of the second metal line portion 140 or the second metal line portion 120 are formed based on a second stage of patterning. In some embodiments, the second metal line portion 140 is above at least some of the first metal line portion 130. In some embodiments, at least some of the first metal line portion 130 is above at least some of the via portion 1930. In some embodiments, the second metal line portion 120 is above at least some of the first metal line portion 110.

In some embodiments, the additional metal line comprises a first barrier portion 132 associated with a first lateral barrier location. In some embodiments, the additional metal line is associated with a via barrier portion 1932 associated with the first lateral barrier location. In some embodiments, the additional metal line comprises a second barrier portion 142 associated with a second lateral barrier location. For example, the second lateral barrier location is different from the first lateral barrier location, at least because the first barrier portion 132 is formed based on a first stage of patterning and the second barrier portion 142 is formed based on a second stage of patterning. In some embodiments, the second barrier portion 142 is above at least some of the first barrier portion 132. In some embodiments, the first barrier portion 132 is above at least some of the via barrier portion 1932. In some embodiments, a difference between the second lateral barrier location and the first lateral barrier location is less than ten nanometers. In other words, an offset associated with the respective barrier portions 142 and 132 is about ten nanometers.

In some embodiments, the metal line comprises a first metal line barrier portion 112 associated with a first lateral metal line barrier location. In some embodiments, the metal line comprises a second metal line barrier portion 122 associated with a second lateral metal line barrier location. For example, the second lateral metal line barrier location is different from the first lateral metal line barrier location, at least because the first metal line barrier portion 112 is formed based on a first stage of patterning and the second metal line barrier portion 122 is formed based on a second stage of patterning. In some embodiments, the second metal line barrier portion 122 is above at least some of the first metal line barrier portion 112. In some embodiments, a difference between the second lateral metal line barrier location and the first lateral metal line barrier location is less than ten nanometers. In other words, an offset associated with the respective metal line barrier portions 122 and 112 is about ten nanometers.

In some embodiments, a barrier layer 192 is formed between at least some of at least one of the second barrier portion 142 and the second ELK dielectric region 104B, the second barrier portion 142 and the first ELK dielectric region 104A, the second barrier portion 142 and the first metal line portion 130, the first metal line portion 130 and the second metal line portion 140, the second barrier portion 142 and the first barrier portion 132, or the first barrier portion 132 and the second metal line portion 140. In some embodiments, the barrier layer 192 is formed along a space etched for the additional metal line, for example. In some embodiments, the barrier layer 192 is formed by atomic layer deposition (ALD).

In some embodiments, a barrier layer 194 is formed between at least some of at least one of the second metal line barrier portion 122 and the second ELK dielectric region 104B, second metal line barrier portion 122 and the first ELK dielectric region 104A, second metal line barrier portion 122 and the first metal line portion 110, the first metal line portion 110 and the second metal line portion 120, the second metal line barrier portion 122 and the first metal line barrier portion 112, or the first metal line barrier portion 112 and the second metal line portion 120. In some embodiments, the barrier layer 194 is formed along a trench etched for the metal line, for example. In some embodiments, the barrier layer 194 is formed by atomic layer deposition (ALD).

In some embodiments, the first barrier portion 132 is associated with a first barrier composition and a first barrier thickness. In some embodiments, the via barrier portion 1932 is associated with the first barrier composition and the first barrier thickness. In some embodiments, the first metal line barrier portion 112 is associated with a first barrier composition and a first barrier thickness 186. For example, the first barrier portion 132 and the first metal line barrier portion 112 are associated with the same barrier composition and barrier thickness. In some embodiments, the second barrier portion 142 is associated with a second barrier composition and a second barrier thickness. In some embodiments, the second metal line barrier portion 122 is associated with a second barrier composition and a second barrier thickness 188. For example, the second barrier portion 142 and the second metal line barrier portion 122 are associated with the same barrier composition and barrier thickness. In some embodiments, the second barrier composition is different from the first barrier composition. Similarly, in some embodiments, the second barrier thickness 188 is different from the first barrier thickness 186. In some embodiments, the second barrier composition is the same as the first barrier composition. In some embodiments, the second barrier thickness 188 is the same as the first barrier thickness 186.

In some embodiments, the first ELK dielectric region 104A comprises the first metal line portion 130, the via portion 1930, and the first metal line portion 110. Additionally, in some embodiments, the first ELK dielectric region 104A comprises the first barrier portion 132, the via barrier portion 1932, and the first metal line barrier portion 112. It will be appreciated that at least some of the via portion 1930 or the barrier runs through the first ESL, according to some embodiments.

In some embodiments, the second ELK dielectric region 104B comprises the second metal line portion 140 and the second metal line portion 120. Additionally, in some embodiments, the second ELK dielectric region 104B comprises the second barrier portion 142 and the second metal line barrier portion 122. In some embodiments, the second ELK dielectric region 104B comprises one or more barrier regions, such as 192 and 194.

Figure 2:
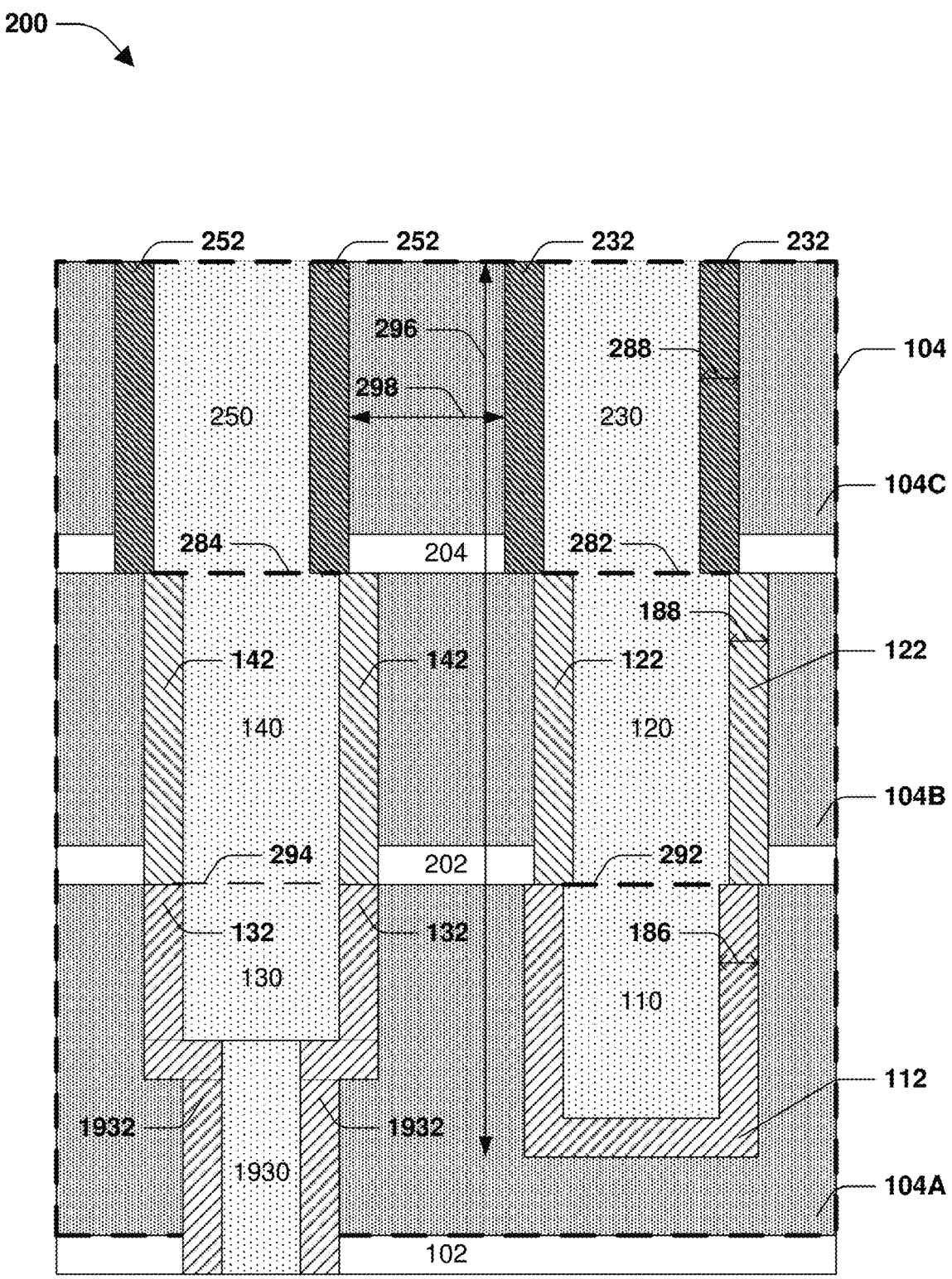
FIG. 2 is a cross-sectional view of an example semiconductor structure for mitigating pattern collapse, according to some embodiments.

FIG. 2 is a cross-sectional view 200 of an example semiconductor structure for mitigating pattern collapse, according to some embodiments. In some embodiments, the semiconductor structure of FIG. 2 comprises a first etch stop layer (ESL) 102. Additionally, the semiconductor structure comprises an extreme low-k (ELK) dielectric region 104. In some embodiments, the ELK dielectric region 104 comprises one or more ELK dielectric regions. For example, the ELK dielectric region 104 comprises a first ELK dielectric region 104A, a second ELK dielectric region 104B, and a third ELK dielectric region 104C. In some embodiments, the first ELK dielectric region 104A is above at least some of the first ESL 102. In some embodiments, a second ESL 202 is above at least some of the first ELK dielectric region 104A. In some embodiments, the second ELK dielectric region 104B is above at least some of the second ESL 202. In some embodiments, a third ESL 204 is above at least some of the second ELK dielectric region 104B. In some embodiments, the third ELK dielectric region 104C is above at least some of the third ESL 204. In some embodiments, at least some of at least one of the ELK dielectric region 104, the first ELK dielectric region 104A, the second ELK dielectric region 104B, or the third ELK dielectric region 104C comprises at least one of a metal line or an additional metal line associated with a via.

In some embodiments, the metal line comprises one or more metal line portions. For example, the metal line comprises a first metal line portion 110, a second metal line portion 120, and a third metal line portion 230. In some embodiments, the first metal line portion 110 is associated with a first lateral metal line location, the second metal line portion 120 is associated with a second lateral metal line location, and the third metal line portion 230 is associated with a third lateral metal line location. In some embodiments, an additional metal line comprises one or more metal line portions. In some embodiments, the additional metal line is associated with a via portion 1930. For example, the additional metal line comprises a first metal line portion 130, a second metal line portion 140, and a third metal line portion 250. In some embodiments, the first metal line portion 130 is associated with a first lateral location, the second metal line portion 140 is associated with a second lateral location, and the third metal line portion 250 is associated with a third lateral location. In some embodiments, the via portion 1930 is associated with the first lateral location. In some embodiments, at least one of the lateral metal line locations is different from at least one of the other lateral metal line locations. For example, the second lateral metal line location is different from the first lateral metal line location, the second lateral metal line location is different from the third lateral metal line location, or the third lateral metal line location is different from the first lateral metal line location. Similarly, at least one of the lateral locations is different from at least one of the other lateral locations. For example, the second lateral location is different from the first lateral location, the second lateral location is different from the third lateral location, or the third lateral location is different from the first lateral location.

In some embodiments, at least one of the first metal line portion 130, the via portion 1930, or the first metal line portion 110 is formed based on a first stage of patterning. In some embodiments, at least one of the second metal line portion 140 or the second metal line portion 120 are formed based on a second stage of patterning. In some embodiments, at least one of the third metal line portion 250 or the third metal line portion 230 is formed based on a third stage of patterning. It will be appreciated, however, that any number of stages of patterning is used to achieve at least one of via formation or metal line formation associated with the semiconductor structure of FIG. 2, for example. In some embodiments, the second metal line portion 140 is above at least some of the first metal line portion 130. In some embodiments, the first metal line portion is above at least some of the via portion 1930. In some embodiments, the second metal line portion 120 is above at least some of the first metal line portion 110. In some embodiments, the third metal line portion 250 is above at least some of the second metal line portion 140. In some embodiments, the third metal line portion 230 is above at least some of the second metal line portion 120.

In some embodiments, the additional metal line comprises one or more barrier portions associated with one or more corresponding lateral barrier locations. In some embodiments, the additional metal line is associated with a via barrier portion 1932. For example, the additional metal line comprises a first barrier portion 132 associated with a first lateral barrier location, a second barrier portion 142 associated with a second lateral barrier location, and a third barrier portion 252 associated with a third lateral barrier location. In some embodiments, the via barrier portion 1932 is associated with the first lateral barrier location. In some embodiments, at least one of the lateral barrier locations is different from at least one of the other lateral barrier locations. For example, the second lateral barrier location is different from the first lateral barrier location, the second lateral barrier location is different from the third lateral barrier location, or the third lateral barrier location is different from the first lateral barrier location. In some embodiments, at least one of the first barrier portion 132 or the via barrier portion 1932 is formed based on a first stage of patterning, the second barrier portion 142 is formed based on a second stage of patterning, and the third barrier portion 252 is formed based on a third stage of patterning. In some embodiments, the second barrier portion 142 is above at least some of the first barrier portion 132. In some embodiments, the third barrier portion 252 is above at least some of the second barrier portion 142.

In some embodiments, the metal line comprises one or more metal line barrier portions associated with one or more corresponding lateral metal line barrier locations. For example, the metal line comprises a first metal line barrier portion 112 associated with a first lateral metal line barrier location, a second metal line barrier portion 122 associated with a second lateral metal line barrier location, and a third metal line barrier portion 232 associated with a third lateral metal line barrier location. In some embodiments, at least one of the lateral metal line barrier locations is different from at least one of the other lateral metal line barrier locations. For example, the second lateral metal line barrier location is different from the first lateral metal line barrier location, the second lateral metal line barrier location is different from the third lateral metal line barrier location, or the third lateral metal line barrier location is different from the first lateral metal line barrier location. In some embodiments, the first metal line barrier portion 112 is formed based on a first stage of patterning, the second metal line barrier portion 122 is formed based on a second stage of patterning, and the third metal line barrier portion 232 is formed based on a third stage of patterning. In some embodiments, the second metal line barrier portion 122 is above at least some of the first metal line barrier portion 112. In some embodiments, the third metal line barrier portion 232 is above at least some of the second metal line barrier portion 122.

In some embodiments, the metal line is associated with an aspect ratio. For example, the aspect ratio of the metal line is determined based on a depth of a metal line 296 and a spacing distance 298. In some embodiments, the spacing distance 298 is a distance between one or more metal lines (not shown). In some embodiments, an interface barrier 292 is formed between at least some of the first metal line portion 110 and the second metal line portion 120. In some embodiments, an interface barrier 282 is formed between at least some of the second metal line portion 120 and the third metal line portion 230. Similarly, an interface barrier 294 is formed between at least some of the first metal line portion 130 and the second metal line portion 140 in some embodiments. Additionally, an interface barrier 284 is formed between at least some of the second metal line portion 140 and the third metal line portion 250 in some embodiments. In some embodiments, a barrier layer (not shown) is formed between one or more respective regions.

In some embodiments, the first barrier portion 132 is associated with a first barrier composition and a first barrier thickness. In some embodiments, the via barrier portion 1932 is associated with the first barrier composition and the first barrier thickness. In some embodiments, the first metal line barrier portion 112 is associated with a first barrier composition and a first barrier thickness 186. For example, the first barrier portion 132, the via barrier portion 1932, and the first metal line barrier portion 112 are associated with the same barrier composition and barrier thickness. In some embodiments, the second barrier portion 142 is associated with a second barrier composition and a second barrier thickness. In some embodiments, the second metal line barrier portion 122 is associated with a second barrier composition and a second barrier thickness 188. For example, the second barrier portion 142 and the second metal line barrier portion 122 are associated with the same barrier composition and barrier thickness. In some embodiments, the third barrier portion 252 is associated with a third barrier composition and a third barrier thickness. In some embodiments, the third metal line barrier portion 232 is associated with a third barrier composition and a third barrier thickness 288. For example, the third barrier portion 252 and the third metal line barrier portion 232 are associated with the same barrier composition and barrier thickness. In some embodiments, at least one of the barrier compositions is different from at least one of the other barrier compositions. For example, the second barrier composition is different from the first barrier composition, the second barrier composition is different from the third barrier composition, or the third barrier composition is different from the first barrier composition. In other embodiments, the barrier compositions are the same. In other words, the first barrier composition is the same as the second barrier composition and the third barrier composition. In some embodiments, at least one of the barrier thicknesses is different from at least one of the other barrier thicknesses. For example, the second barrier thickness 188 is different from the first barrier thickness 186, the second barrier thickness 188 is different from the third barrier thickness 288, or the third barrier thickness 288 is different from the first barrier thickness 186. In other embodiments, the first barrier thickness 186 is the same as the second barrier thickness 188 and the third barrier thickness 288.

Figure 3:
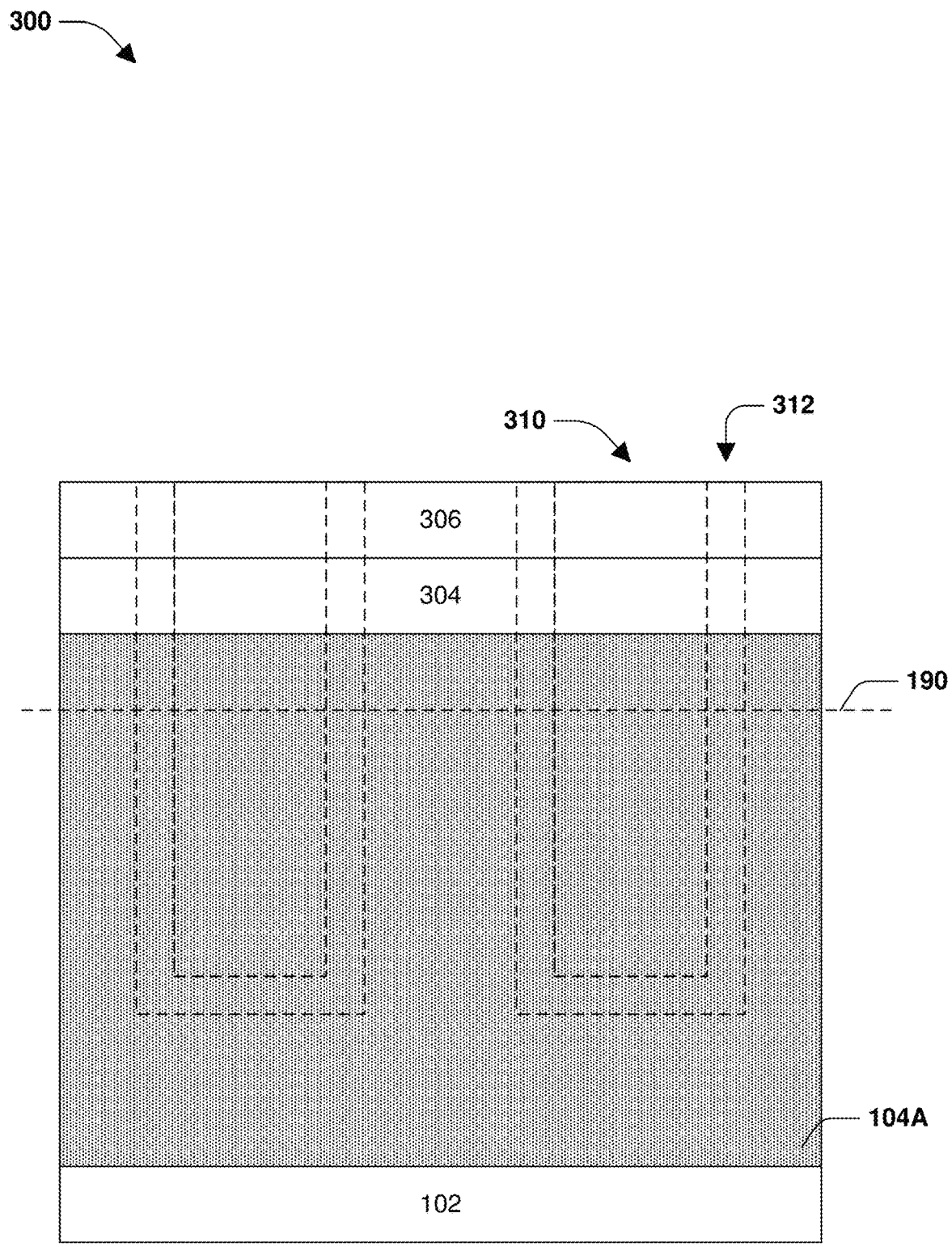
FIG. 3 is a cross-sectional view of an example semiconductor structure for mitigating pattern collapse, during formation, according to some embodiments.

FIG. 3 is a cross-sectional view 300 of an example semiconductor structure for mitigating pattern collapse, during formation, according to some embodiments. In some embodiments, a first etch stop layer (ESL) is formed 102. In some embodiments, a first extreme low-k (ELK) dielectric region 104A is formed above at least some of the first ESL 102. In some embodiments, a first cap region 304 is formed above at least some of the first ELK dielectric region 104A. In some embodiments, a first hard mask (HM) region 306 is formed above at least some of the first cap region 304. It will be appreciated that boundary 190 indicates a boundary associated with the semiconductor structure after a first stage of patterning. In some embodiments, 310 is associated with a first lateral metal line location of a first metal line portion, such as the first metal line portion 110 of FIG. 1, for example. In some embodiments, 312 is associated with a first lateral metal line barrier location of a first metal line barrier portion, such as the first metal line barrier portion 112 of FIG. 1, for example.

Figure 4:
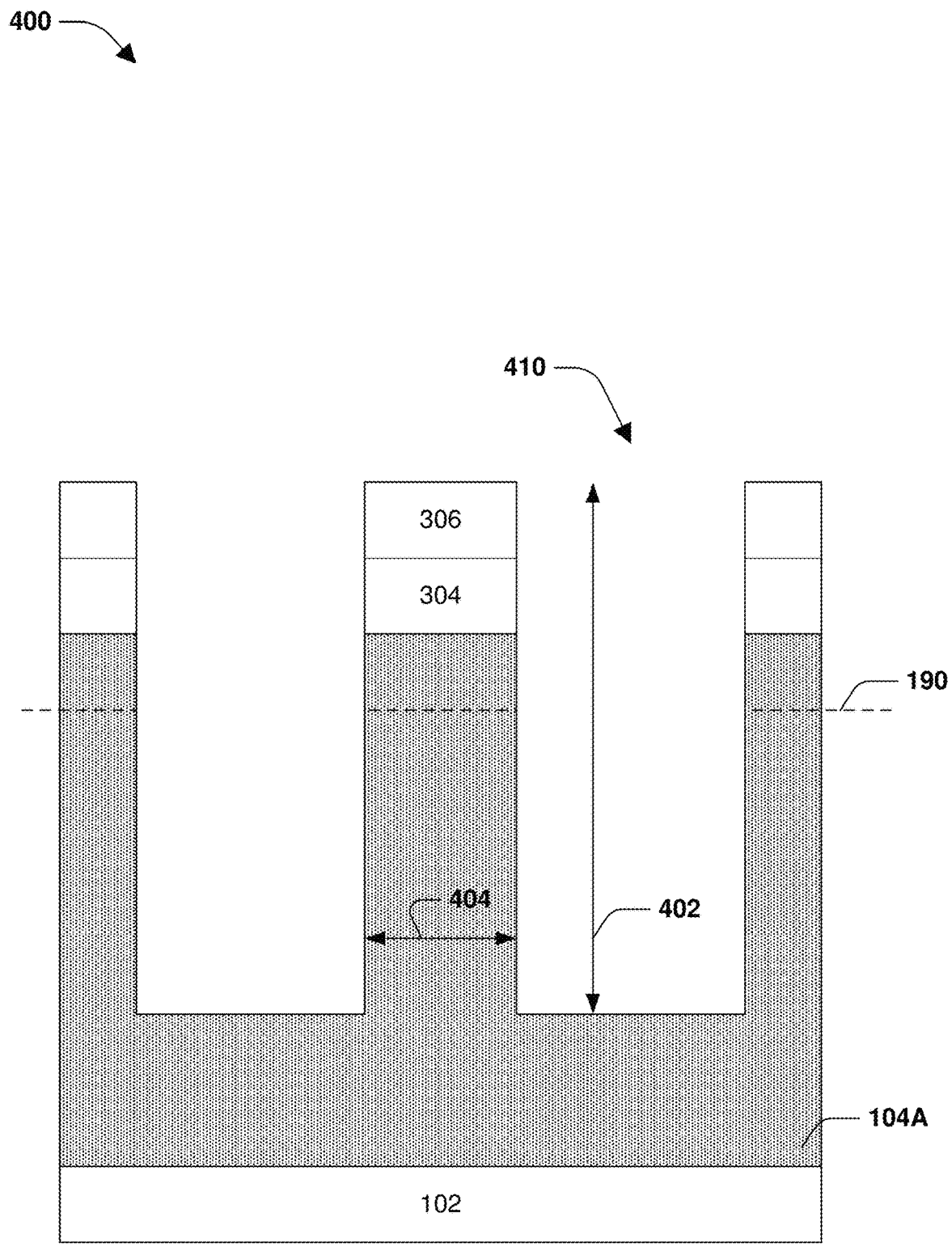
FIG. 4 is a cross-sectional view of an example semiconductor structure for mitigating pattern collapse, during formation, according to some embodiments.

FIG. 4 is a cross-sectional view 400 of an example semiconductor structure for mitigating pattern collapse, during formation, according to some embodiments. In FIG. 4, a first trench portion 410 of a trench (not entirely shown) is etched within at least a portion of the first ELK dielectric region 104A. For example, the trench is not entirely illustrated by FIG. 4, at least because two or more stage patterning is used to form trench portions and metal line portions such that the trench of the semiconductor structure is not completely etched based on a single stage, for example. It will be appreciated that the first trench portion 410 is associated with a first trench portion aspect ratio determined based on a first trench depth 402 and a trench to trench spacing 404. In some embodiments, the first trench portion aspect ratio is the first trench depth 402 divided by the trench to trench spacing 404. In some embodiments, etching associated with one or more ELK dielectric regions is controlled such that a corresponding aspect ratio is less than four. In some embodiments, a trench is etched in an ELK dielectric region such that the trench is associated with an aspect ratio from at least about 2.5 to at least about 3.5. Accordingly, in some embodiments, the first trench portion 410 of the trench is etched within at least a portion of the first ELK dielectric region 104A based on a first aspect ratio. For example, the first aspect ratio is less than four. For another example, the first aspect ratio is from at least about 2.5 to at least about 3.5. In this way, pattern collapse associated with the first trench portion 410 of the trench of the semiconductor structure is mitigated, at least because an aspect ratio associated with the first trench portion 410 is controlled such that the first trench portion 410 is not etched in a marginally stable manner, for example. In other words, the first trench portion 410 is not etched deep enough for an increased risk of collapse. In some embodiments, a first wet clean is performed after etching the first trench portion 410 of the trench. In some embodiments, the etching of the first ELK dielectric region 104A is based on patterning the first HM region 306.

Figure 5:
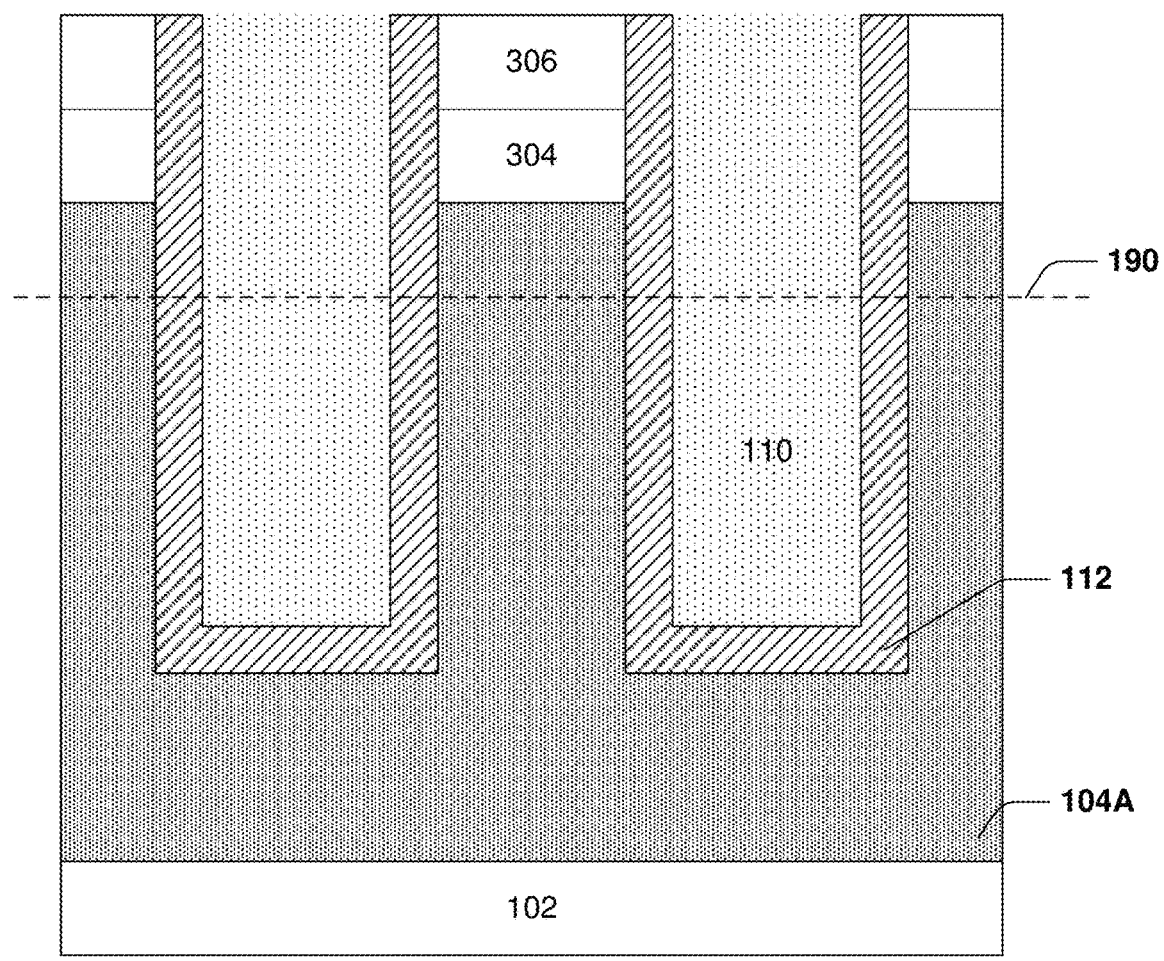
FIG. 5 is a cross-sectional view of an example semiconductor structure for mitigating pattern collapse, during formation, according to some embodiments.

FIG. 5 is a cross-sectional view 500 of an example semiconductor structure for mitigating pattern collapse, during formation, according to some embodiments. In some embodiments, a first metal line barrier portion 112 of a metal line barrier is formed within the first trench portion 410 of the trench of FIG. 4, for example. In some embodiments, the first metal line barrier portion 112 is formed at least one of along a floor of the first ELK dielectric region 104A, along a wall of the first ELK dielectric region 104A, along a wall of the first cap region 304, along a wall of the first HM region 306, or above at least some of the first HM region 306 (not shown). In some embodiments, the first metal line barrier portion 112 is formed at a first lateral metal line barrier location, such as 312 of FIG. 3, for example. Accordingly, the first metal line barrier portion 112 is formed at a first lateral metal line barrier location within the first ELK dielectric region 104A. In some embodiments, the first metal line barrier portion 112 is associated with at least one of a first barrier composition or a first barrier thickness. In some embodiments, a first metal line portion 110 is formed within the first trench portion 410 of the trench of FIG. 4, for example. In some embodiments, the first metal line portion 110 is formed above at least some of the first metal line barrier portion 112. In some embodiments, the first metal line portion 110 is formed at a first lateral metal line location, such as 310 of FIG. 3, for example. Accordingly, the first metal line portion 110 of a metal line is formed at a first lateral metal line location within the first ELK dielectric region 104A.

Figure 6:
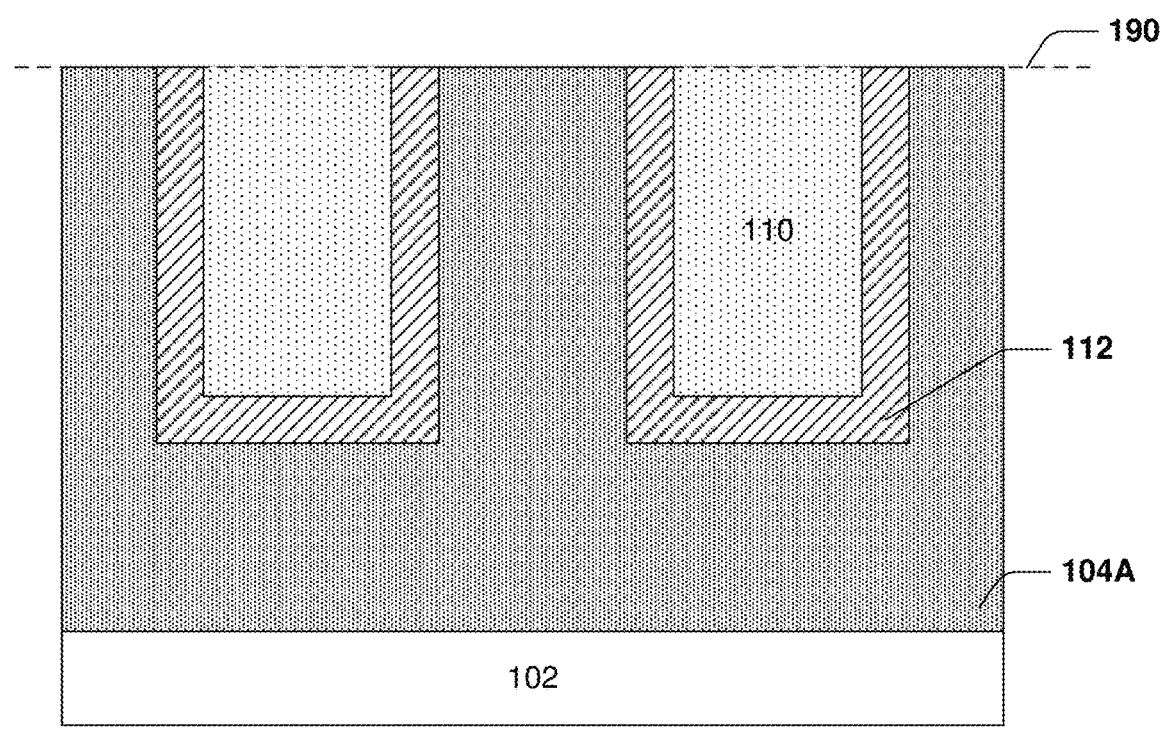
FIG. 6 is a cross-sectional view of an example semiconductor structure for mitigating pattern collapse, during formation, according to some embodiments.

FIG. 6 is a cross-sectional view 600 of an example semiconductor structure for mitigating pattern collapse, during formation, according to some embodiments. In some embodiments, at least some of at least one of the first metal line barrier portion 112 above the first HM region 306 or the first metal line portion 110 above the first HM region 306 is removed. In some embodiments, at least some of the first HM region 306 is removed. In some embodiments, at least some of the first cap region 304 is removed. In some embodiments, at least some of at least one of the first ELK dielectric region 104A above boundary 190, the first metal line portion 110 above boundary 190, or the first metal line barrier portion 112 above boundary 190 is removed. For example, at least some of the respective regions are removed by performing a first chemical mechanical planarization (CMP). In some embodiments, the first CMP is performed on at least some of at least one of the first ELK dielectric region 104A, the first metal line portion 110 of the metal line, or the first metal line barrier portion 112 of the metal line barrier. In this way, the semiconductor structure of FIG. 6 is associated with a surface that is substantially flush with boundary 190, for example. It will be appreciated that in some embodiments, techniques disclosed, such as techniques associated with FIG. 3-FIG. 6 are implemented to facilitate formation of a semiconductor structure, such as the semiconductor structure of FIG. 1 or FIG. 2, for example.

Figure 7:
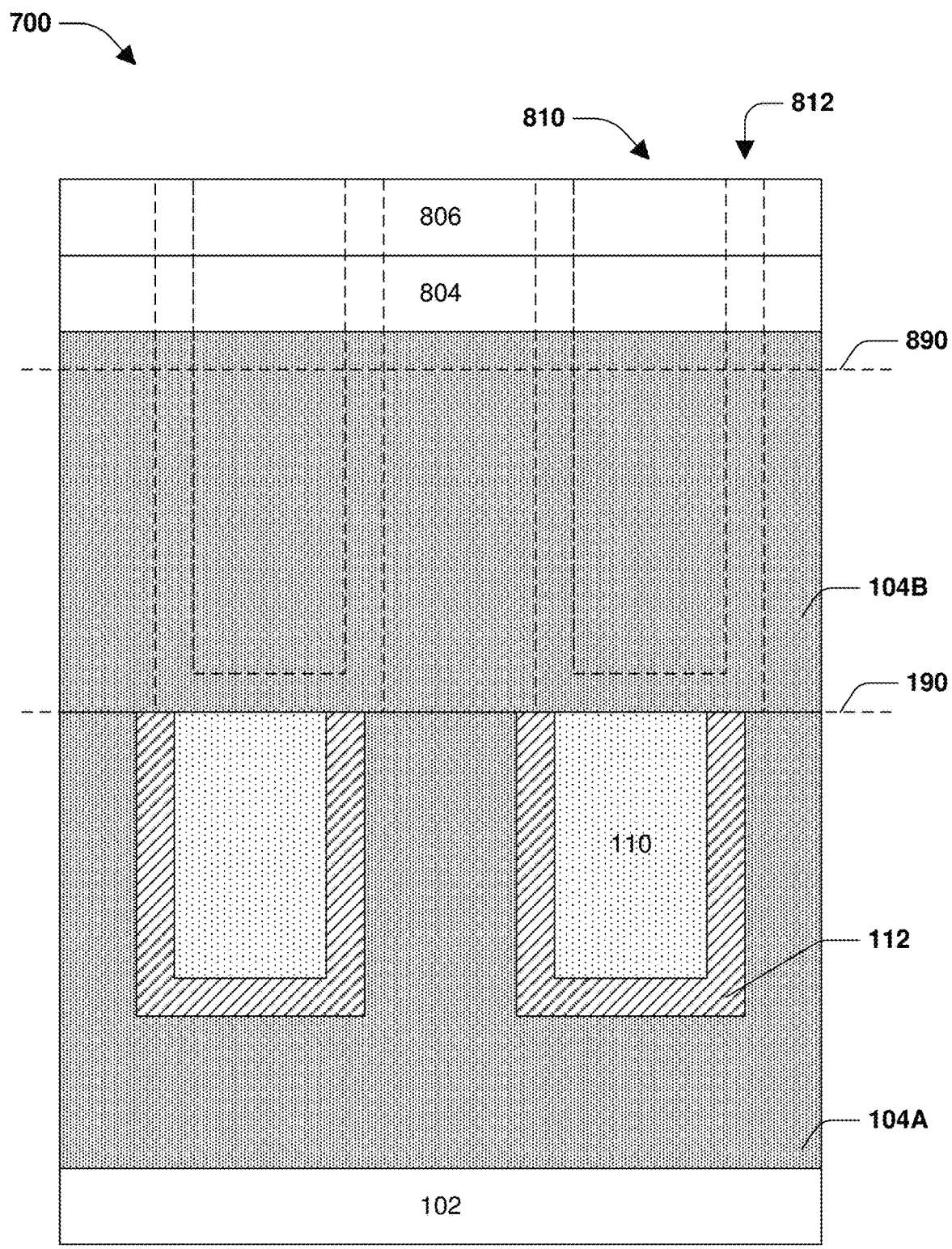
FIG. 7 is a cross-sectional view of an example semiconductor structure for mitigating pattern collapse, during formation, according to some embodiments.

Accordingly, FIG. 7 is a cross-sectional view 700 of an example semiconductor structure for mitigating pattern collapse, during formation, according to some embodiments. For example, a second ELK dielectric region 104B is formed above at least some of at least one of the first metal line portion 110 of the metal line, the first ELK dielectric region 104A, or the first metal line barrier portion 112. In some embodiments, the second ELK dielectric region is generally formed above boundary 190. In some embodiments, a second cap 804 is formed above at least some of the second ELK dielectric region 104B. In some embodiments, a second HM region 806 is formed above at least some of the second cap region 804. It will be appreciated that boundary 890 indicates a boundary associated with the semiconductor structure after a second stage of patterning. In some embodiments, 810 is associated with a second lateral metal line location of a second metal line portion. In some embodiments, 812 is associated with a second lateral metal line barrier location of a second metal line barrier portion. It will be appreciated that in some embodiments, the second lateral metal line barrier location is different from the first lateral metal line barrier location. Similarly, the second lateral metal line location is different from the first lateral metal line location, in some embodiments.

Figure 8:
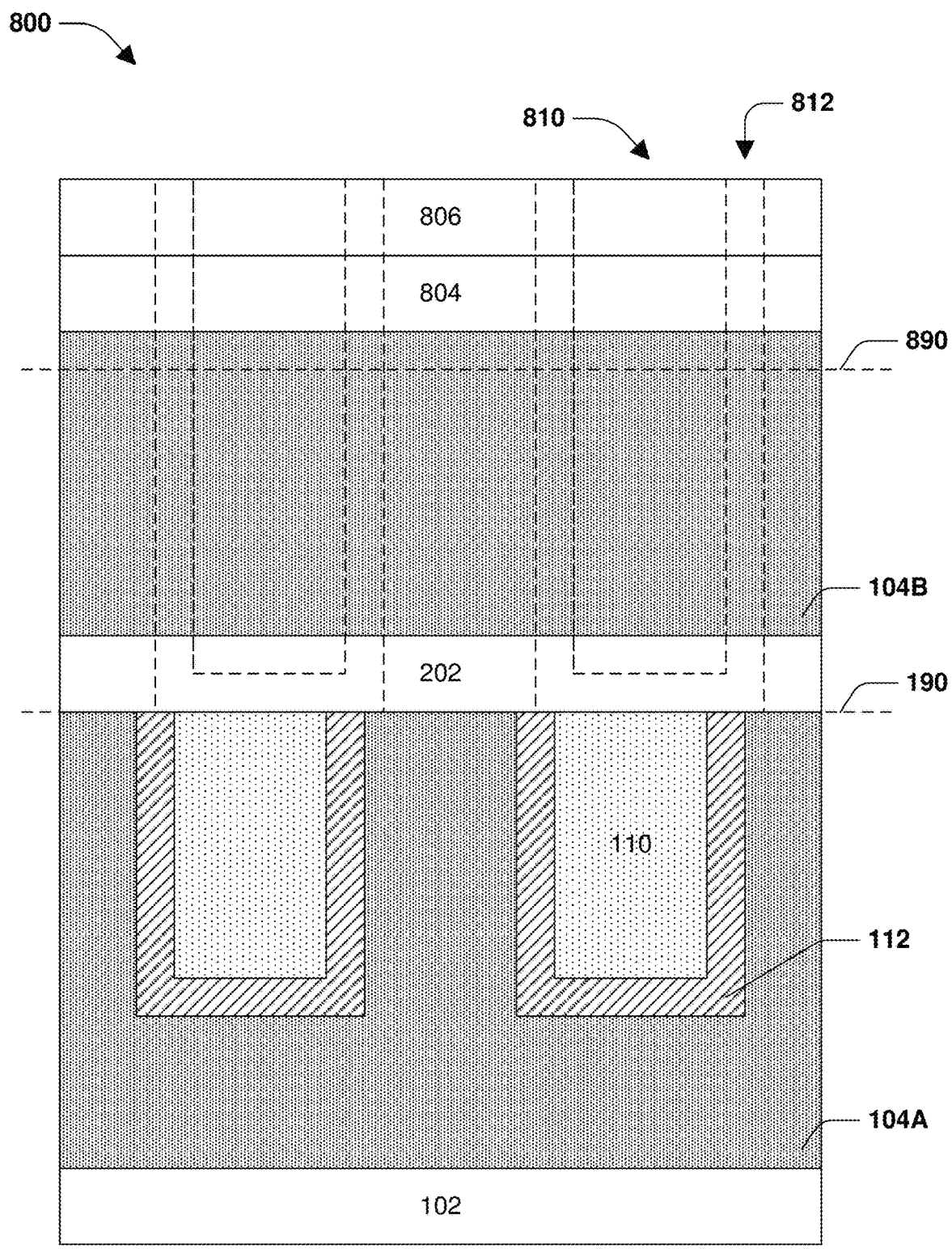
FIG. 8 is a cross-sectional view of an example semiconductor structure for mitigating pattern collapse, during formation, according to some embodiments.

FIG. 8 is a cross-sectional view 800 of an example semiconductor structure for mitigating pattern collapse, during formation, according to some embodiments. FIG. 8 is similar to FIG. 7, except that a second ESL region 202 is formed above boundary 190. In some embodiments, the second ESL region 202 is formed above at least some of at least one of the first metal line portion 110 of the metal line, the first ELK dielectric region 104A, or the first metal line barrier portion 112. In some embodiments, the second ELK dielectric region 104B is formed above at least some of the second ESL region 202. In this way, one or more additional regions are formed between the first ELK dielectric region 104A and the second ELK dielectric region 104B. It will be appreciated, however, that any number of regions are formed between or within any of the respective regions according to some embodiments. For example, in some embodiments, one or more additional regions are formed within the first ELK dielectric region 104A. In some embodiments, at least one of the additional regions is an ESL region. In some embodiments, at least one of the additional regions is an oxide region.

Figure 9:
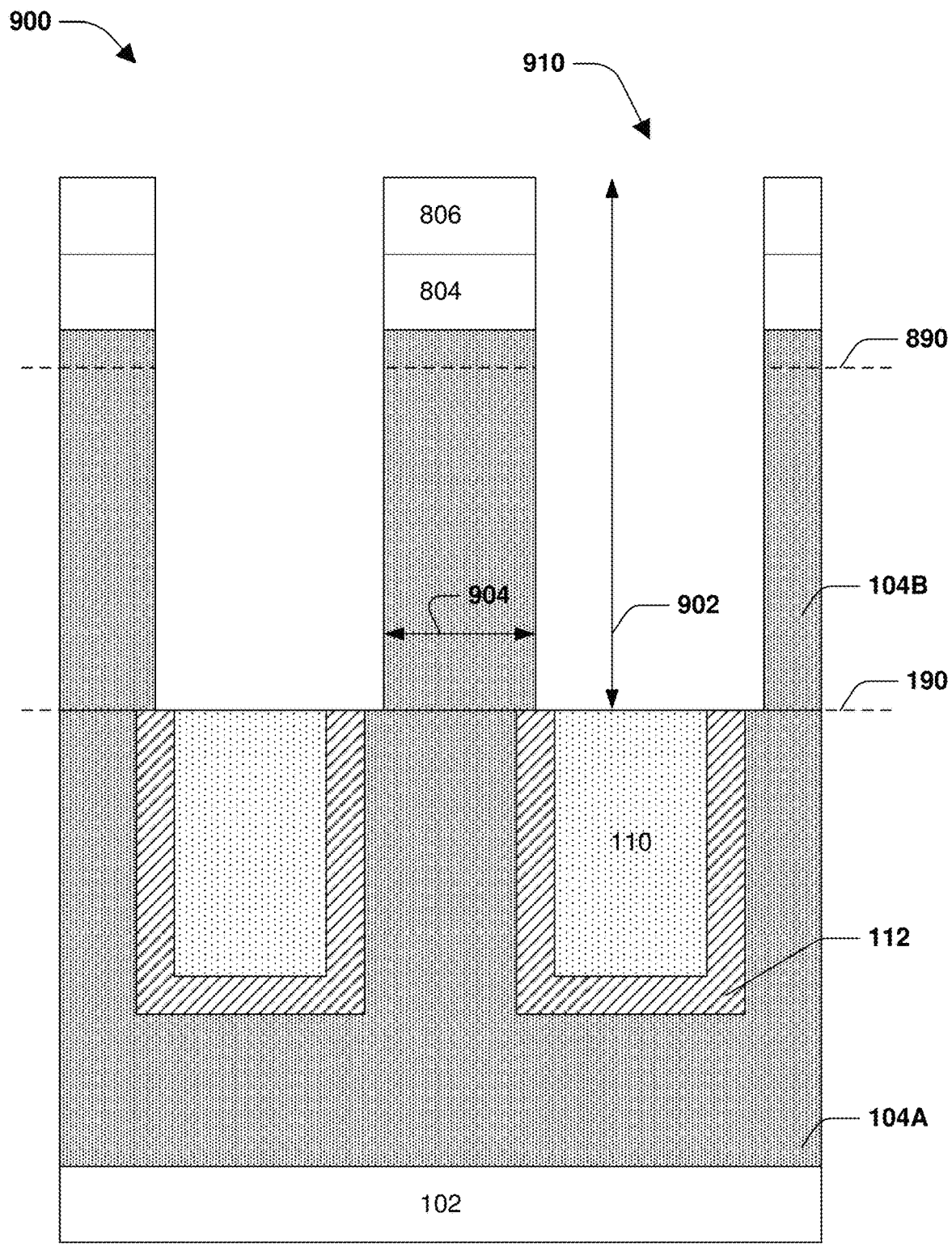
FIG. 9 is a cross-sectional view of an example semiconductor structure for mitigating pattern collapse, during formation, according to some embodiments.

FIG. 9 is a cross-sectional view 900 of an example semiconductor structure for mitigating pattern collapse, during formation, according to some embodiments. In some embodiments, a second trench portion 910 of the trench is etched within at least a portion of the second ELK dielectric region 104B based on a second aspect ratio. In FIG. 9, a second trench portion 910 of a trench is etched within at least a portion of the second ELK dielectric region 104B. It will be appreciated that according to some embodiments, FIG. 9 is associated with a second stage of patterning for trench formation. In some embodiments, the second trench portion 910 is associated with a second trench portion aspect ratio. For example, the second trench portion aspect ratio is determined based on a second trench depth 902 and a second trench to trench spacing 904. In some embodiments, second trench portion aspect ratio is the second trench depth 902 divided by the second trench to trench spacing 904. In some embodiments, the second trench portion 910 is etched such that an associated second trench portion aspect ratio is less than four. For example, the second trench portion aspect ratio is from at least about 2.5 to at least about 3.5. In this way, pattern collapse associated with the second trench portion 910 of the trench of the semiconductor structure is mitigated, at least because an aspect ratio associated with the second trench portion 910 is controlled such that the second trench portion 910 is not etched in an unstable manner, for example. In some embodiments, a second wet clean is performed after etching the second trench portion 910 of the trench. In some embodiments, the etching of the second ELK dielectric region 104A is based on patterning the second HM region 806.

Figure 10:
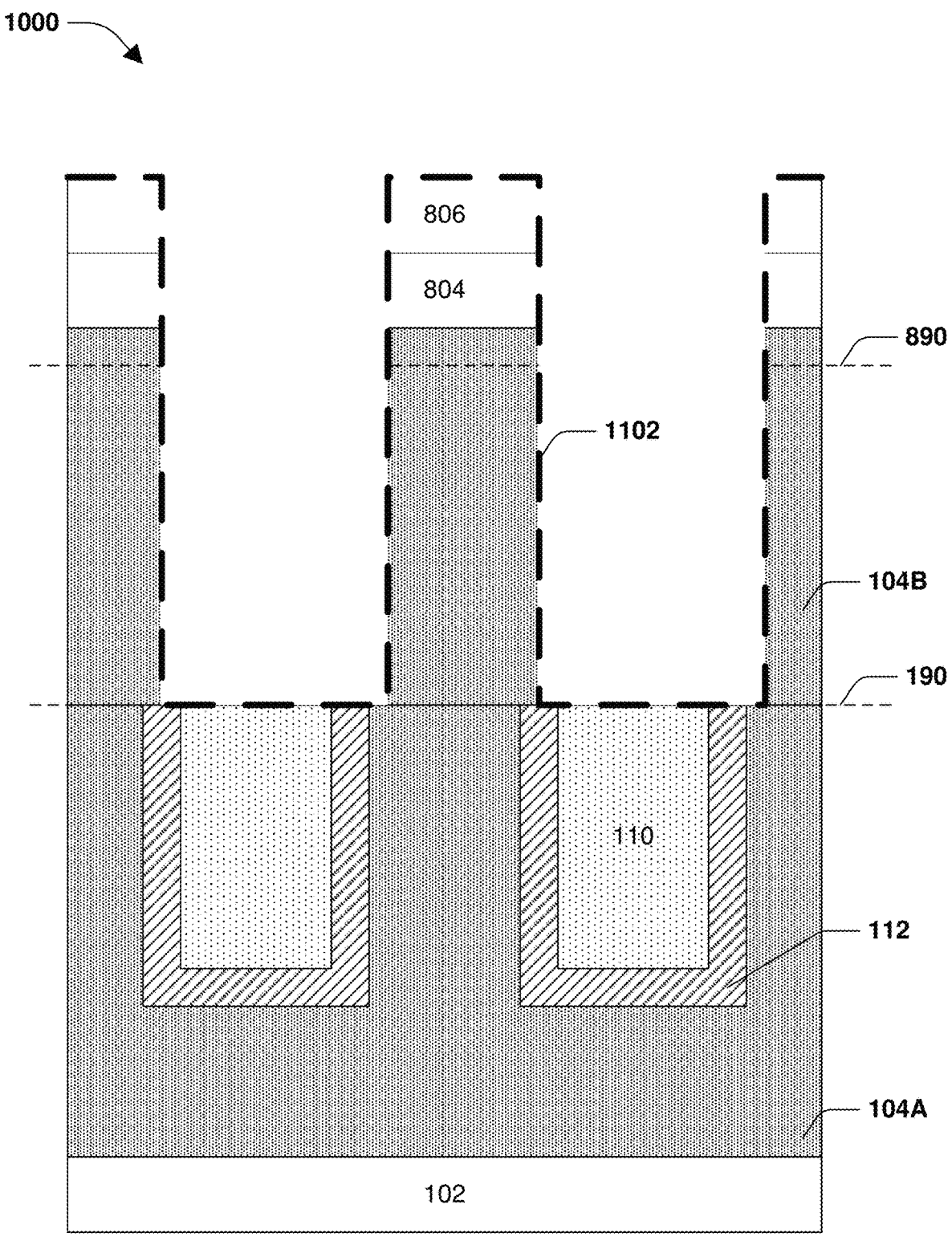
FIG. 10 is a cross-sectional view of an example semiconductor structure for mitigating pattern collapse, during formation, according to some embodiments.

FIG. 10 is a cross-sectional view 1000 of an example semiconductor structure for mitigating pattern collapse, during formation, according to some embodiments. In some embodiments, a barrier layer 1102 is deposited. For example, the barrier layer 1102 is formed based on atomic layer deposition (ALD). In some embodiments, the barrier layer 1102 is formed at least one of above a floor of the second trench portion 910, along a wall of the second trench portion 910, above at least some of the second HM region 806, along a wall of the second HM region 806, along a wall of the second cap region 804, along a wall of the second ELK dielectric region 104B, or above border 190, for example.

Figure 11:
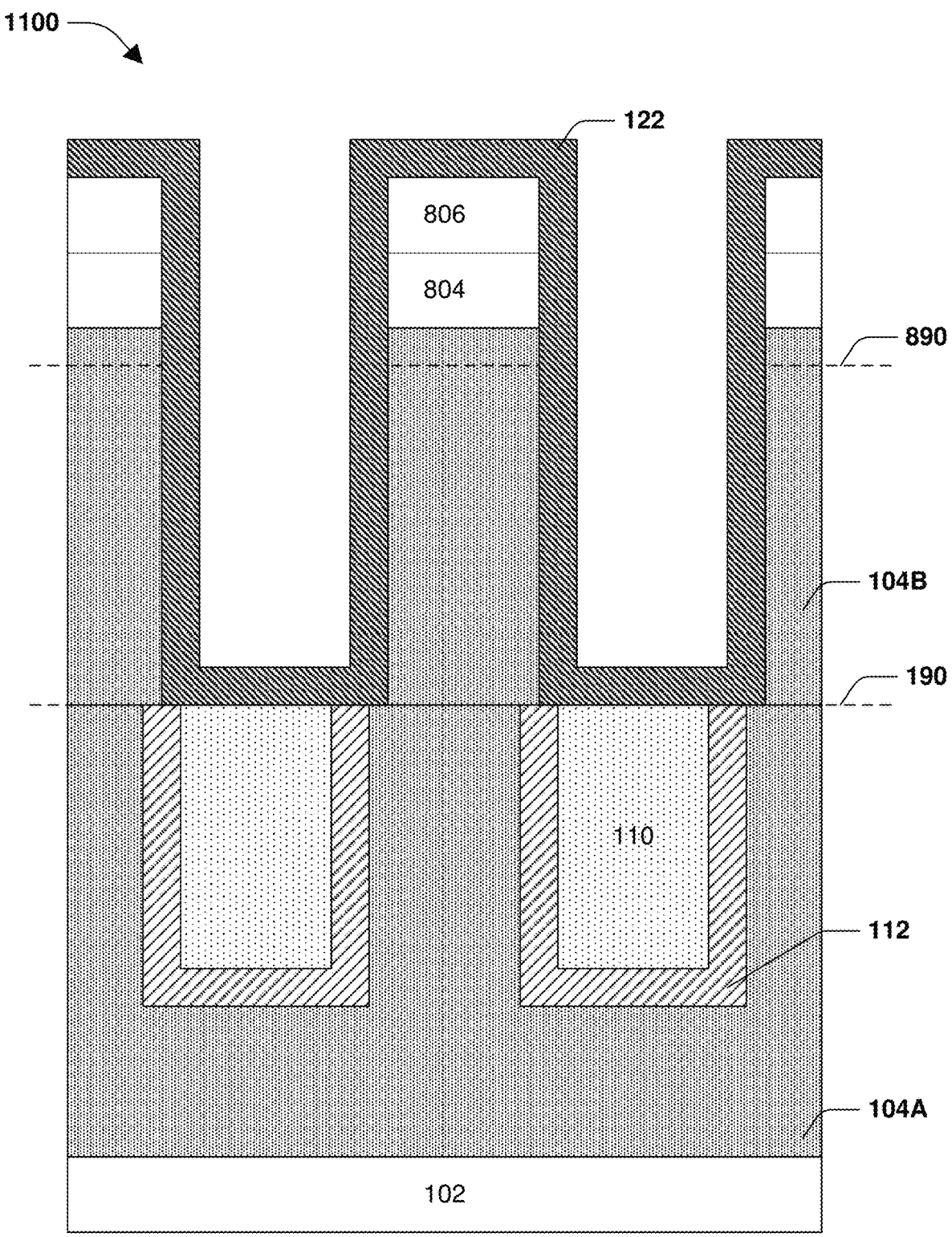
FIG. 11 is a cross-sectional view of an example semiconductor structure for mitigating pattern collapse, during formation, according to some embodiments.

FIG. 11 is a cross-sectional view 1100 of an example semiconductor structure for mitigating pattern collapse, during formation, according to some embodiments. In some embodiments, a second metal line barrier portion 122 is formed. In some embodiments, the second metal line barrier portion 122 is formed at least one of above a floor of the second trench portion 910, along a wall of the second trench portion 910, above at least some of the second HM region 806, along a wall of the second HM region 806, along a wall of the second cap region 804, along a wall of the second ELK dielectric region 104B, or above border 190, for example. In some embodiments, a second metal line barrier portion 122 of a metal line barrier is formed within the second trench portion 910 of the trench of FIG. 9, for example. In some embodiments, the second metal line barrier portion 122 is formed at a second lateral metal line barrier location, such as at 812 of FIG. 8, for example. Accordingly, the second metal line barrier portion 122 is formed at a second lateral metal line barrier location within the second ELK dielectric region 104B. In some embodiments, the second metal line barrier portion 122 is associated with at least one of a second barrier composition or a second barrier thickness. It will be appreciated that in some embodiments, the second barrier thickness is different from the first barrier thickness of the first metal line barrier portion 112. Similarly, in some embodiments, the second barrier composition is different from the first barrier composition of the first metal line barrier portion 112.

Figure 12:
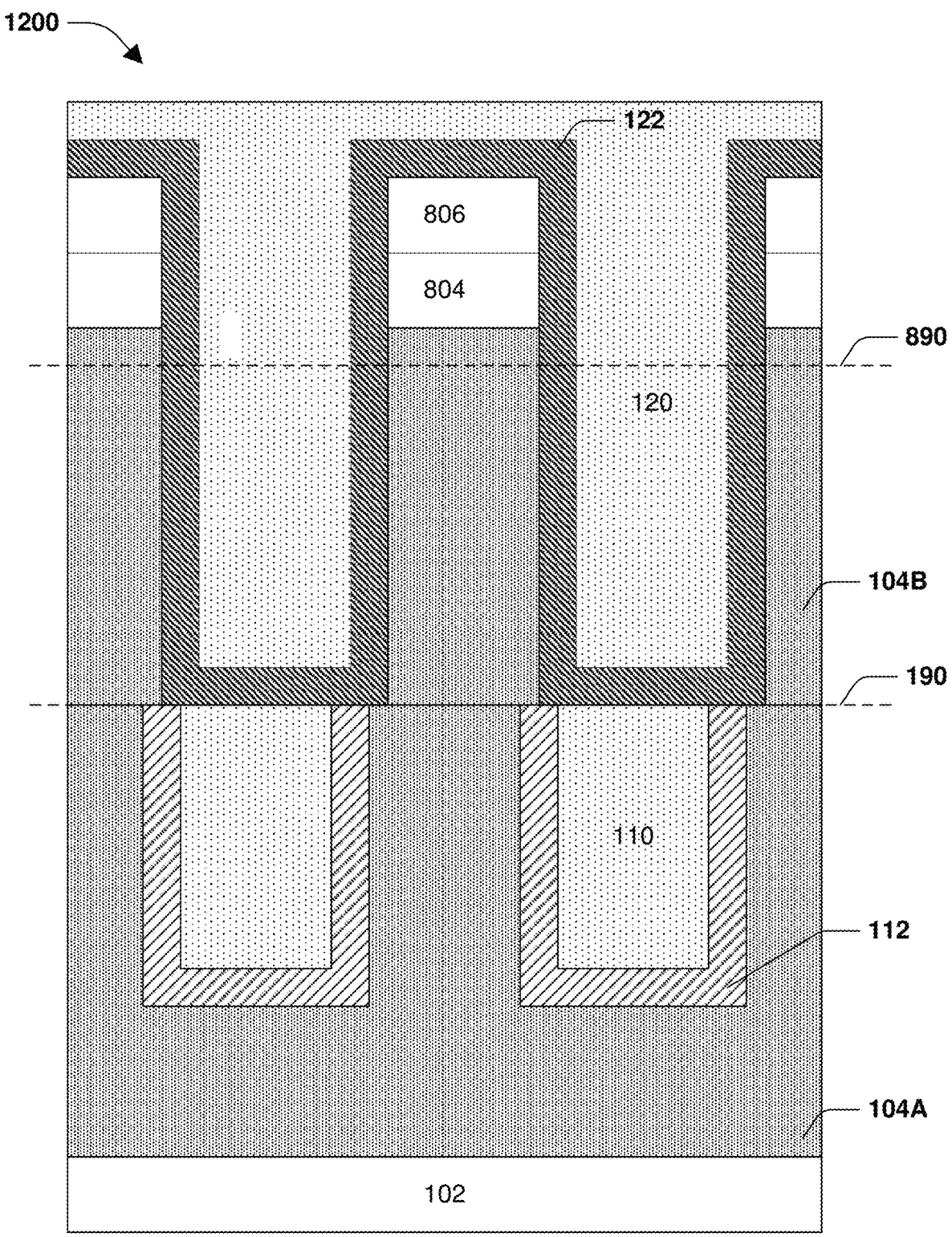
FIG. 12 is a cross-sectional view of an example semiconductor structure for mitigating pattern collapse, during formation, according to some embodiments.

FIG. 12 is a cross-sectional view 1200 of an example semiconductor structure for mitigating pattern collapse, during formation, according to some embodiments. In some embodiments, a second metal line portion 120 is formed. In some embodiments, the second metal line portion 120 is formed above at least some of the second metal line barrier portion 122. In some embodiments, the second metal line portion 120 is formed above at least some of the second HM region 806. In some embodiments, the second metal line portion 120 is formed within the second trench portion 910 of the trench of FIG. 9, for example. In some embodiments, the second metal line portion 120 is formed at a second lateral metal line location, such as 810 of FIG. 8, for example. Accordingly, the second metal line portion 120 of a metal line is formed at a second lateral metal line location within the second ELK dielectric region 104B.

Figure 13:
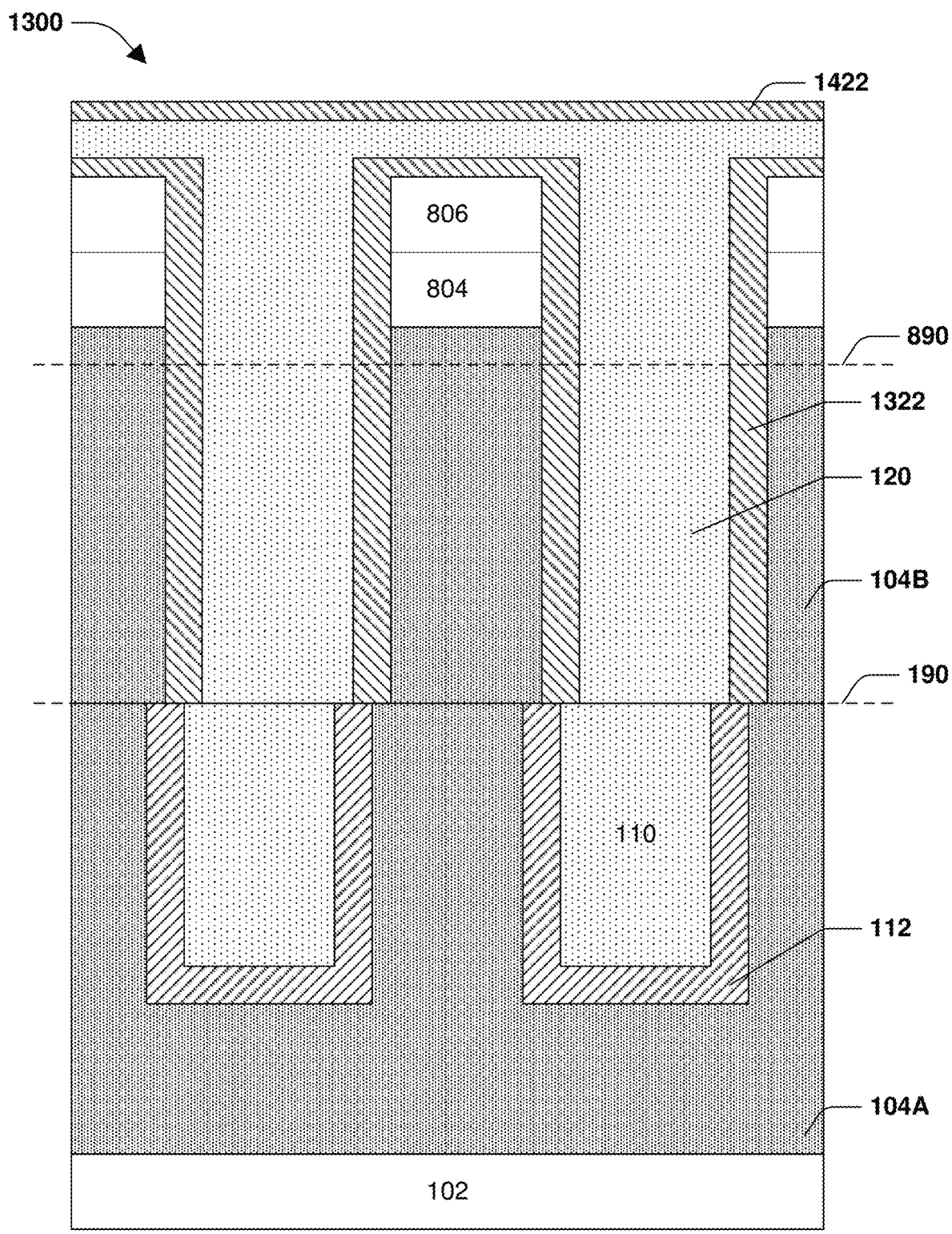
FIG. 13 is a cross-sectional view of an example semiconductor structure for mitigating pattern collapse, during formation, according to some embodiments.

FIG. 13 is a cross-sectional view 1300 of an example semiconductor structure for mitigating pattern collapse, during formation, according to some embodiments. In some embodiments, the second metal line barrier portion 122 is annealed. In some embodiments, the semiconductor structure of FIG. 13 is annealed. In this way, portions of the second metal line barrier portion 122 between the first metal line portion 110 and the second metal line portion 120 diffuse to come in contact with the second ELK dielectric region 104B. In some embodiments, the annealing results in a top barrier layer 1422. In some embodiments, annealing the second metal line barrier portion 122 mitigates an interface barrier between the first metal line portion 110 and the second metal line portion 120, such as interface barrier 292 of FIG. 2, for example. In this way, a self-formed barrier 1322 is formed. In some embodiments, a composition associated with the second metal line barrier portion 122 changes based on oxidation, for example.

Figure 14:
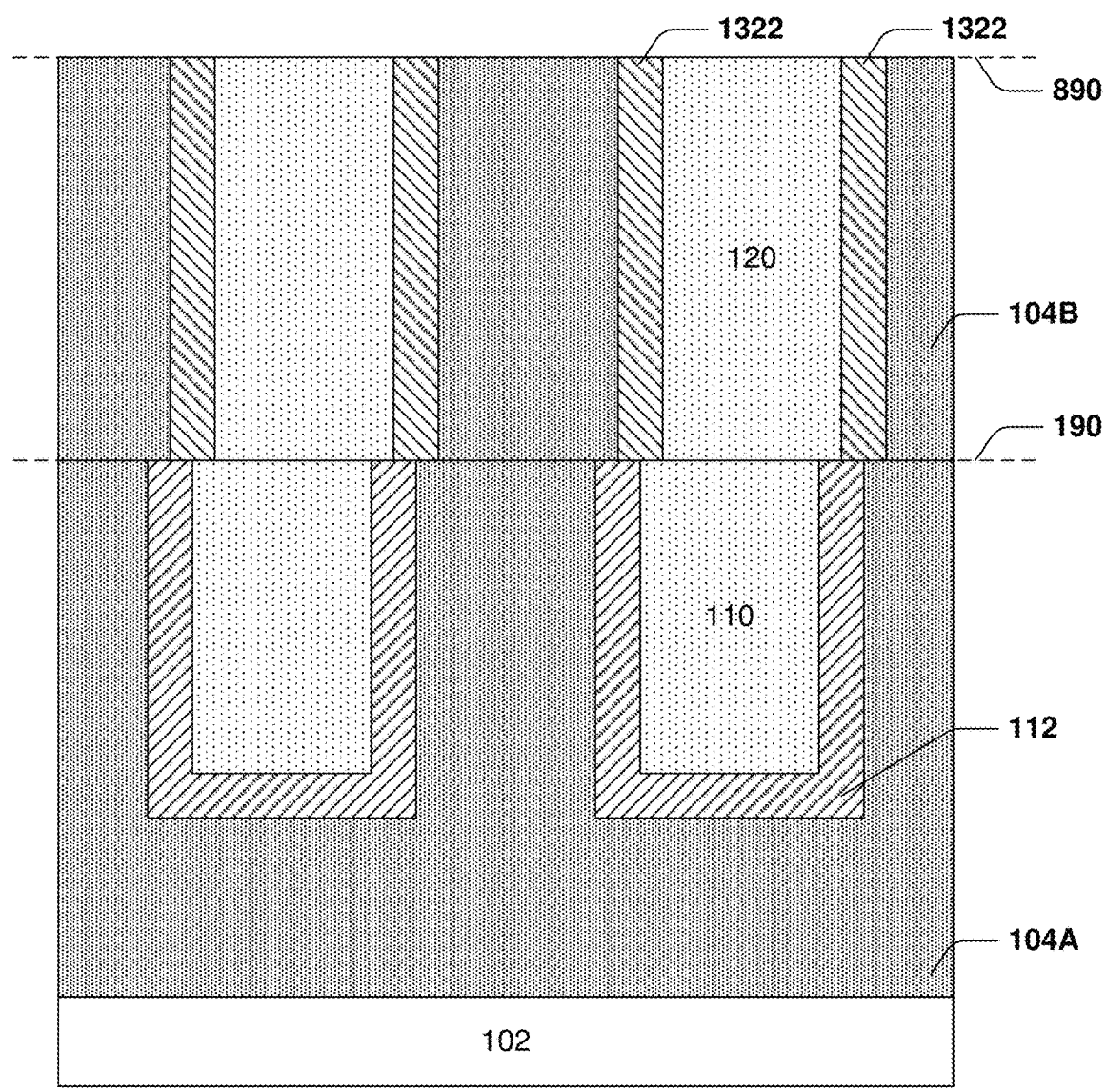
FIG. 14 is a cross-sectional view of an example semiconductor structure for mitigating pattern collapse, during formation, according to some embodiments.
Figure 15:
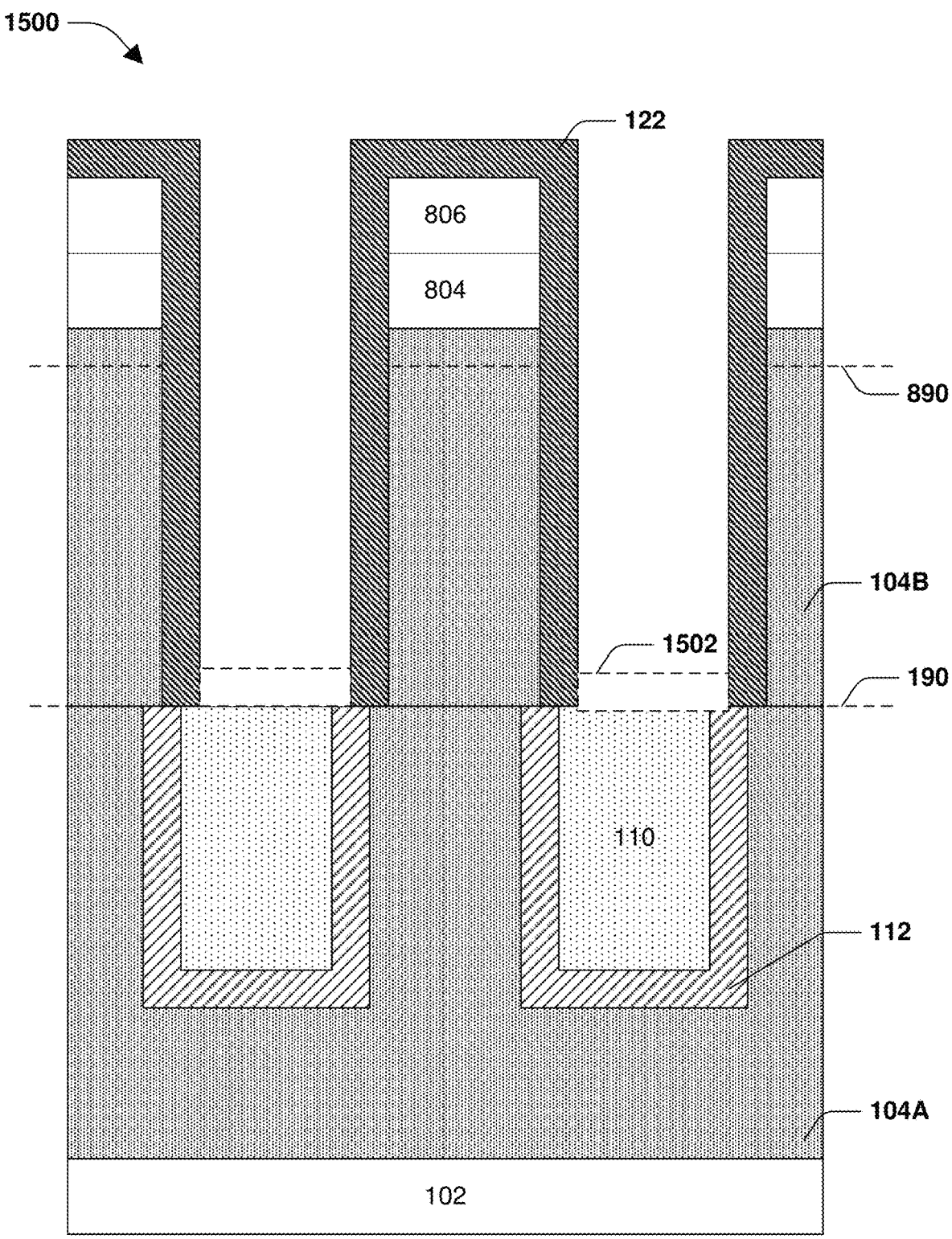
FIG. 15 is a cross-sectional view of an example semiconductor structure for mitigating pattern collapse, during formation, according to some embodiments.

FIG. 14 is a cross-sectional view 1400 of an example semiconductor structure for mitigating pattern collapse, during formation, according to some embodiments. In some embodiments, at least some of the top barrier layer 1422 is removed. In some embodiments, at least some of the second metal line portion 120 above the second HM region 806 is removed. In some embodiments, at least some of the self-formed barrier 1322 above the second HM region 806 is removed. Additionally, at least some of at least one of the second HM region 806 or the second cap region 804 is removed. In some embodiments, at least some of at least one of the self-formed barrier 1322 above boundary 890, the second metal line portion 120 above boundary 890, or the second ELK dielectric region 104B above boundary 890 is removed. For example, a second CMP is performed on at least some of at least one of the second ELK region 104B, the second metal line portion 120, the second metal line barrier portion 122, or the self-formed barrier 1322. In this way, the semiconductor structure of FIG. 14 is associated with a surface that is substantially flush with boundary 890, for example.

FIG. 15 is a cross-sectional view 1500 of an example semiconductor structure for mitigating pattern collapse, during formation, according to some embodiments. According to some aspects, FIG. 15 is described with respect to FIG. 11, for example. In some embodiments, at least some of the second metal line barrier portion 122 of FIG. 11 is re-sputtered. For example, at least a portion of the second metal line barrier portion 122 associated with a floor of the second trench portion 910 of FIG. 9 is removed. In some embodiments, a bottom portion 1502 of the second metal line barrier portion 122 is removed based on re-sputtering.

Figure 16:
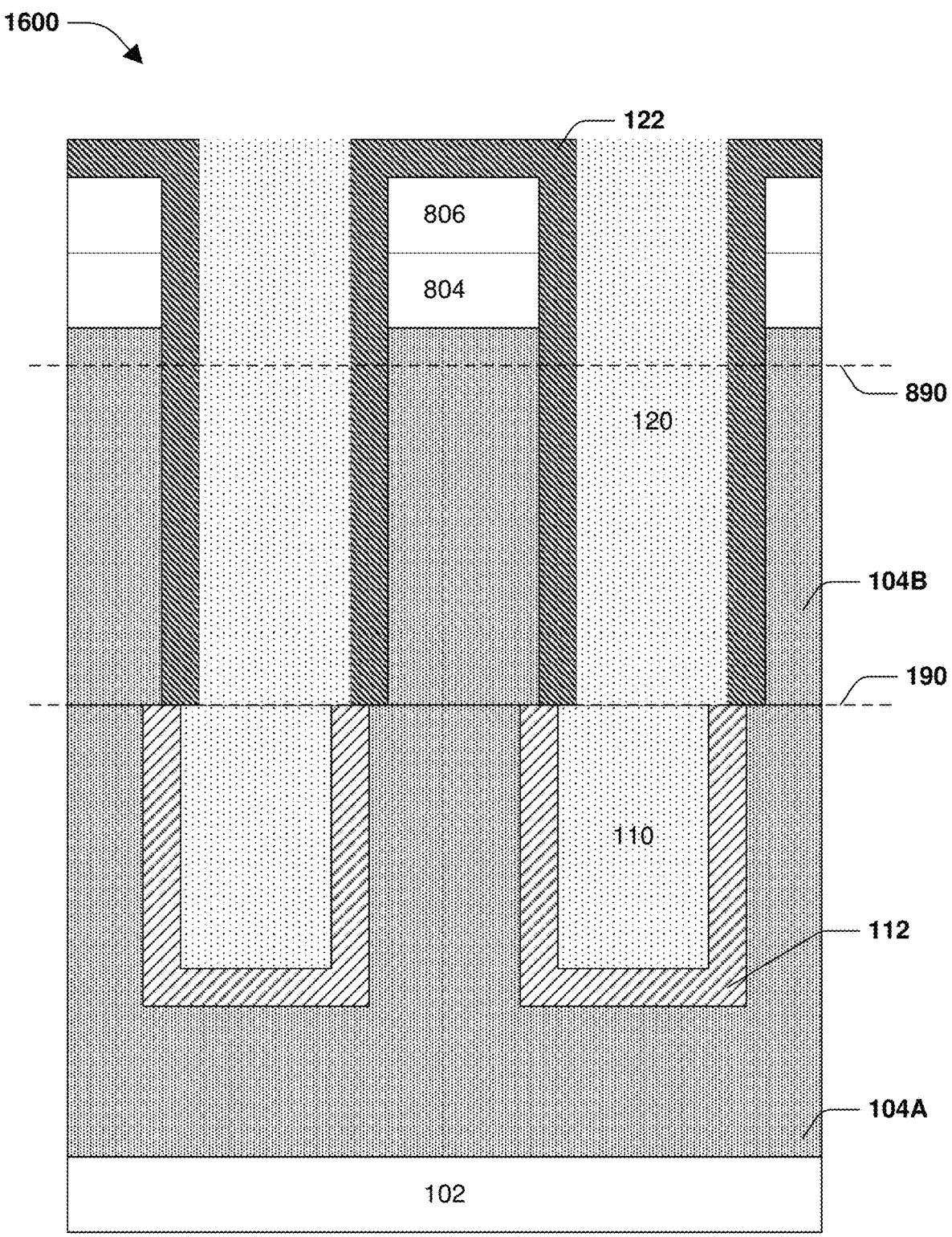
FIG. 16 is a cross-sectional view of an example semiconductor structure for mitigating pattern collapse, during formation, according to some embodiments.

FIG. 16 is a cross-sectional view 1600 of an example semiconductor structure for mitigating pattern collapse, during formation, according to some embodiments. In some embodiments, the second metal line portion 120 is formed at least some of at least one of above boundary 190, above the first metal line portion 110, or above the first metal line barrier portion 112. In some embodiments, the second metal line portion 120 is formed above at least some of the second HM region 806. In some embodiments, the second metal line portion 120 is formed within the second trench portion 910 of the trench of FIG. 9, for example. In some embodiments, the second metal line portion 120 is formed at a second lateral metal line location, such as 810 of FIG. 8, for example. Accordingly, the second metal line portion 120 of a metal line is formed at a second lateral metal line location within the second ELK dielectric region 104B.

Figure 17:
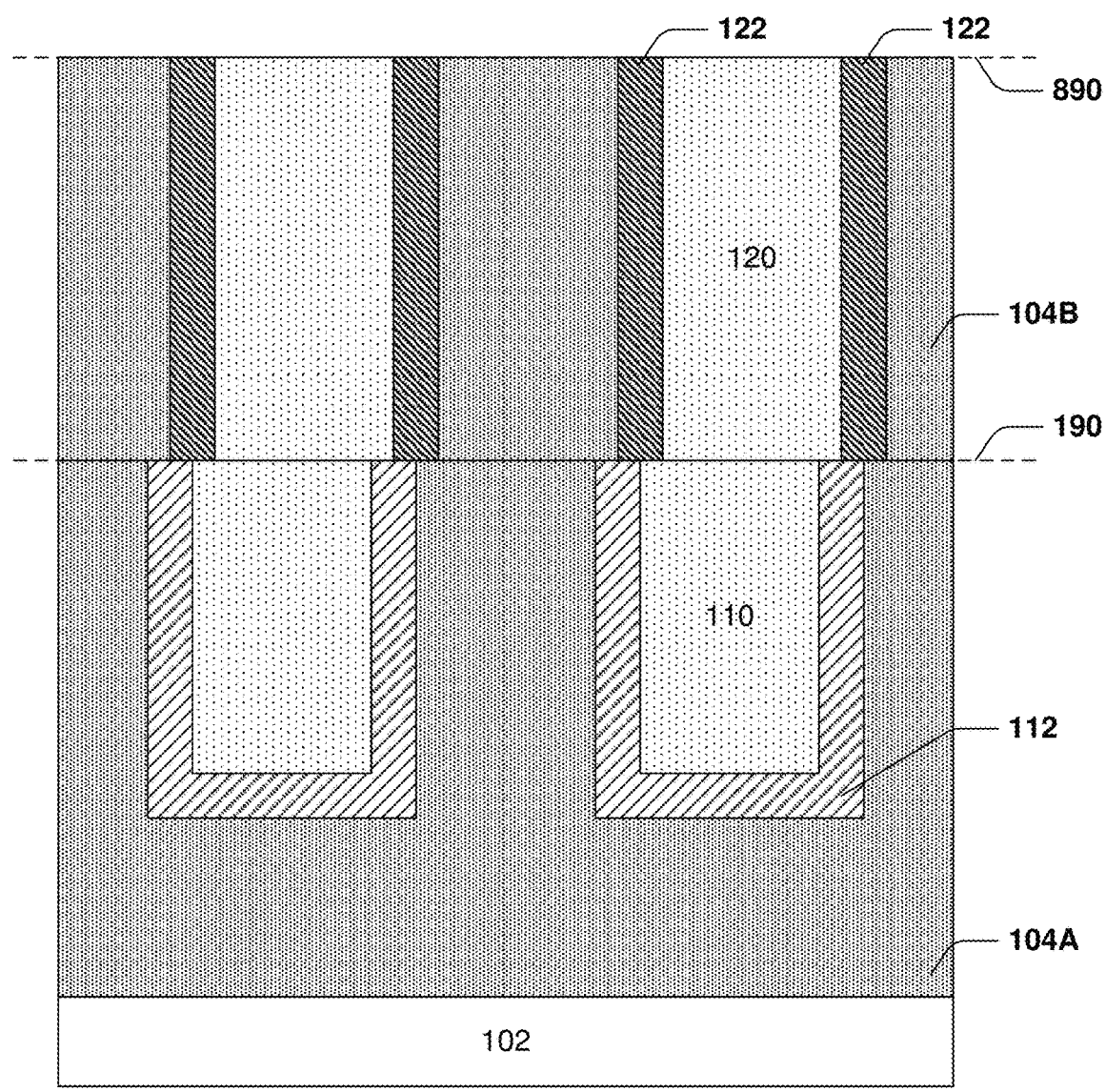
FIG. 17 is a cross-sectional view of an example semiconductor structure for mitigating pattern collapse, during formation, according to some embodiments.

FIG. 17 is a cross-sectional view 1700 of an example semiconductor structure for mitigating pattern collapse, during formation, according to some embodiments. In some embodiments, at least some of the second metal line portion 120 above the second HM region 806 is removed. In some embodiments, at least some of the second metal line barrier portion 122 above the second HM region 806 is removed. Additionally, at least some of at least one of the second HM region 806 or the second cap region 804 is removed. In some embodiments, at least some of at least one of the second metal line barrier portion 122 above boundary 890, the second metal line portion 120 above boundary 890, or the second ELK dielectric region 104B above boundary 890 is removed. For example, a second CMP is performed on at least some of at least one of the second ELK region 104B, the second metal line portion 120, or the second metal line barrier portion 122. In this way, the semiconductor structure of FIG. 16 is associated with a surface that is substantially flush with boundary 890, for example.

Figure 18:
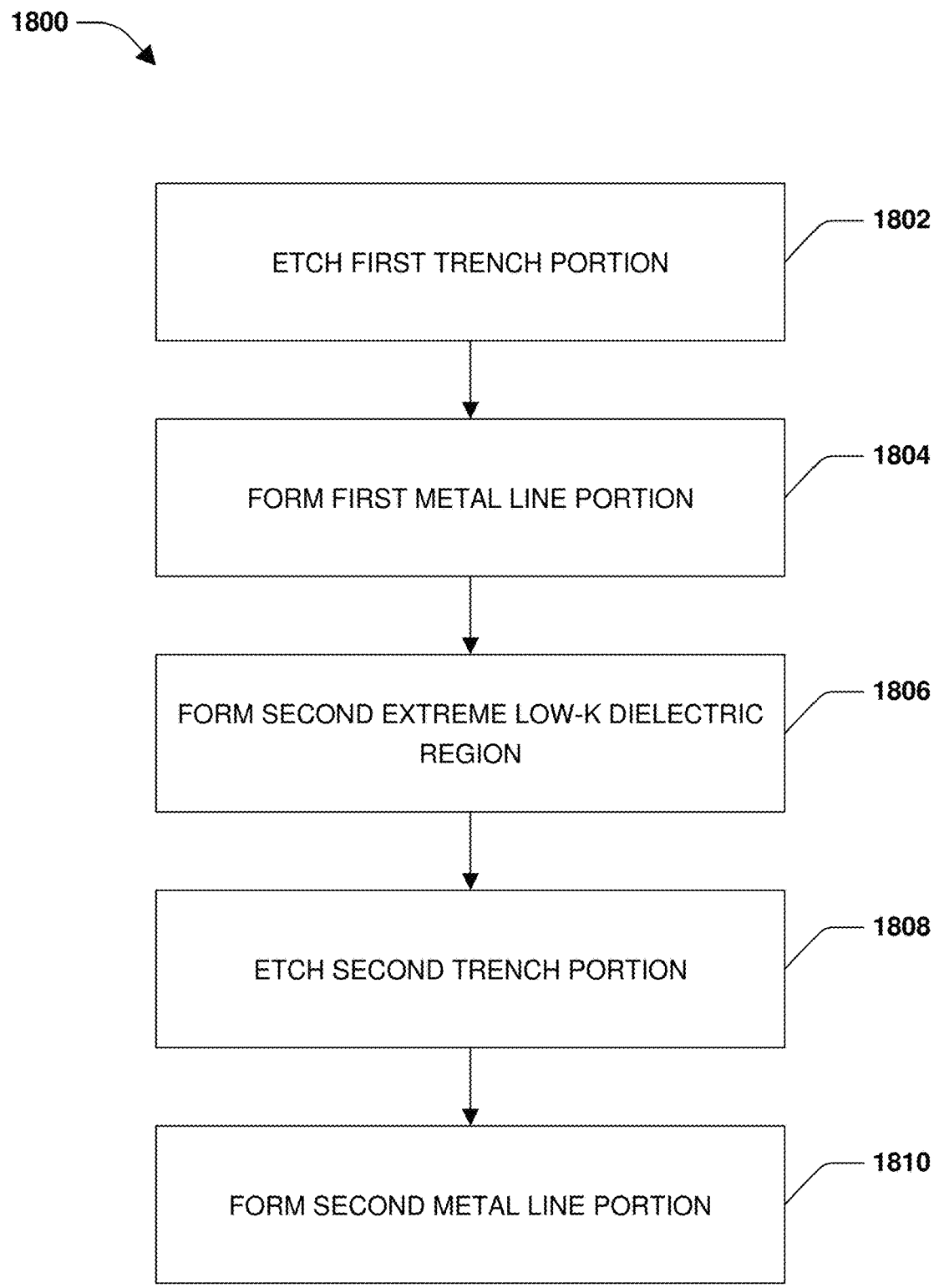
FIG. 18 is a flow diagram of an example method for forming a semiconductor structure associated with mitigating pattern collapse, according to some embodiments.

FIG. 18 is a flow diagram of an example method 1800 for forming a semiconductor structure associated with mitigating pattern collapse, according to some embodiments. At 1802, the method comprises etching a first trench portion within a first ELK dielectric region. At 1804, the method comprises forming a first metal line portion. At 1806, the method comprises forming a second ELK dielectric region. At 1808, the method comprises etching a second trench portion. At 1810, the method comprises forming a second metal line portion. It will be appreciated that any number of metal line portions is formed in this manner. For example, in some embodiments, the method comprises forming a third ELK dielectric region above at least some of at least one of the second ELK dielectric region or the second metal line portion of the metal line. In some embodiments, the method comprises forming a third cap region above at least some of the third ELK dielectric region. In some embodiments, the method comprises forming a third hard mask (HM) region above at least some of the third cap region. In some embodiments, the method comprises etching a third trench portion of the trench within at least a portion of the third ELK dielectric region based on a third aspect ratio. In some embodiments, the method comprises forming a third metal line portion of the metal line within the third trench portion of the trench and performing a third chemical mechanical planarization (CMP) on at least some of at least one of the third ELK dielectric region or the third metal line portion of the metal line.

One or more techniques or systems for mitigating pattern collapse are provided herein. Generally, one or more trenches are etched within a region, and one or more corresponding metal lines are formed within the respective trenches. In some embodiments, respective metal lines or vias are formed based on two or more stage patterning. In this way, pattern collapse associated with respective trenches within the region is mitigated. For example, a semiconductor structure comprises an extreme low-k (ELK) dielectric region. In some embodiments, the ELK dielectric region comprises at least one of a metal line or an additional metal line associated with a via. In some embodiments, a metal line comprises one or more metal line portions. For example, the metal line comprises a first metal line portion associated with a first lateral location and a second metal line portion associated with a second lateral location. In some embodiments, the second lateral location is different from the first lateral location. For example, the metal line comprises a first metal line portion associated with a first lateral metal line location and a second metal line portion associated with a second lateral metal line location. In some embodiments, the second lateral metal line location is different from the first lateral metal line location.

In some embodiments, a first metal line portion is formed based on a first stage of patterning and a second metal line portion is formed based on a second stage of patterning. In other words, the first metal line portion is not necessarily lined up with the second metal line portion, at least because a mask alignment associated with the first stage of patterning is not exactly the same as a mask alignment associated with the second stage of patterning. In some embodiments, the first stage of patterning comprises etching a first trench portion of a trench within at least a portion of an extreme low-k (ELK) dielectric region based on a first aspect ratio. In some embodiments, the first state of patterning comprises forming a first metal line portion of a metal line within the first trench portion of the trench. In some embodiments, the second stage of patterning comprises forming a second ELK dielectric region above at least some of at least one of the first metal line portion of the metal line or the ELK dielectric region. In some embodiments, the second stage of patterning comprises etching a second trench portion of the trench within at least a portion of the second ELK dielectric region based on a second aspect ratio. In some embodiments, the second stage of patterning comprises forming a second metal line portion of the metal line within the second trench portion of the trench.

According to some aspects, a semiconductor structure for mitigating pattern collapse is provided, comprising a first etch stop layer (ESL). In some embodiments, the semiconductor structure comprises an extreme low-k (ELK) dielectric region above the first ESL. In some embodiments, the ELK dielectric region comprises at least some of one of a metal line or an additional metal line associated with a via. For example, the additional metal line comprises a via portion associated with a first lateral location, a first metal line portion associated with the first lateral location, and a second metal line portion associated with a second lateral location. In some embodiments, the second lateral location is different from the first lateral location. For example, the metal line comprises a first metal line portion associated with a first lateral metal line location and a second metal line portion associated with a second lateral metal line location. In some embodiments, the second lateral metal line location is different from the first lateral metal line location.

According to some aspects, a method for forming a semiconductor structure associated with mitigating pattern collapse is provided, comprising etching a first trench portion of a trench within at least a portion of a first extreme low-k (ELK) dielectric region based on a first aspect ratio. In some embodiments, the method comprises forming a first metal line portion of a metal line within the first trench portion of the trench. In some embodiments, the method comprises forming a second ELK dielectric region above at least some of at least one of the first metal line portion of the metal line or the first ELK dielectric region. In some embodiments, the method comprises etching a second trench portion of the trench within at least a portion of the second ELK dielectric region based on a second aspect ratio. In some embodiments, the method comprises forming a second metal line portion of the metal line within the second trench portion of the trench.

According to some aspects, a semiconductor structure for mitigating pattern collapse is provided, comprising a first etch stop layer (ESL). In some embodiments, the semiconductor structure comprises a first extreme low-k (ELK) dielectric region above the first ESL. For example, the first ELK dielectric region comprises at least some of at least one of a via portion associated with a first lateral location or a first metal line portion associated with a first lateral metal line location. In some embodiments, the semiconductor structure comprises a second ELK dielectric region above the first ELK dielectric region. For example, the second ELK dielectric region comprises a second metal line portion associated with at least one of a second lateral location or a second lateral metal line location. In some embodiments, the second lateral metal line location is different from the first lateral metal line location. In some embodiments, the semiconductor structure comprises a first barrier layer between at least some of the via portion and the second metal line portion. In some embodiments, the semiconductor structure comprises a first barrier layer between at least some of the first metal line portion and the second metal line portion.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated based on this description. Further, it will be understood that not all operations are necessarily present in each embodiment provided herein.

It will be appreciated that layers, features, regions, elements, such as the first etch stop layer (ESL), second ESL, extreme low-k (ELK) dielectric region, second ELK dielectric region, third ELK dielectric region, first cap region, second cap region, first hard mask (HM) region, second HM region, vias, via portions, via barriers, via barrier portions, metal lines, metal line portions, metal line barriers, metal line barrier portions, trenches, trench portions, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, features, regions, elements, etc. mentioned herein, such as implanting techniques, etching techniques, doping techniques, spin-on techniques, such as spin coating, sputtering techniques such as magnetron or ion beam sputtering, growth techniques, such as thermal growth or deposition techniques such as chemical vapor deposition (CVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur based on a reading and understanding of this specification and the annexed drawings. The disclosure includes all such modifications and alterations and is limited only by the scope of the following claims.

What is claimed is:

1. A method for forming a semiconductor structure associated with mitigating pattern collapse, comprising:
    etching a first trench within a first dielectric region based on a first aspect ratio;
    forming a first metal line within the first trench;
    forming a second dielectric region above at least one of the first metal line or the first dielectric region;
    etching a second trench within the second dielectric region based on a second aspect ratio, wherein a portion of the first metal line and a portion of the first dielectric region are exposed through the second trench;
    forming a metal line barrier within the second trench;
    removing a portion of the metal line barrier over the first metal line to expose at least some of the portion of the first metal line; and
    forming a second metal line within the second trench after the removing.

2. The method of claim 1, comprising, before the etching a first trench:
    forming the first dielectric region above a first etch stop layer (ESL);
    forming a cap region above the first dielectric region; and
    forming a hard mask (HM) region above the cap region.

3. The method of claim 2, comprising, after the forming a first metal line and before the forming a second dielectric region:
    removing at least some of the cap region;
    removing at least some of the HM region; and
    performing a first chemical mechanical planarization (CMP) on at least one of the first dielectric region or the first metal line.

4. The method of claim 1, comprising performing a first wet clean after the etching a first trench and before the forming a first metal line.

5. The method of claim 1, comprising, before the etching a second trench:
    forming a cap region above the second dielectric region; and
    forming a hard mask (HM) region above the cap region.

6. The method of claim 5, comprising, after the forming a second metal line:
    removing at least some of the cap region;
    removing at least some of the HM region; and
    performing a second chemical mechanical planarization (CMP) on at least one of the second dielectric region or the second metal line.

7. The method of claim 1, comprising, before the forming a first metal line, forming a second metal line barrier at a first lateral metal line barrier location within the first dielectric region.

8. The method of claim 1, comprising annealing the metal line barrier.

9. The method of claim 8, wherein the annealing causes the metal line barrier to diffuse.

10. The method of claim 1, comprising:
    forming a third dielectric region above at least one of the second metal line or the second dielectric region;
    forming a cap region above the third dielectric region;
    forming a hard mask (HM) region above the cap region;
    etching a third trench within the third dielectric region based on a third aspect ratio; and
    forming a third metal line within the third trench.

11. The method of claim 1, wherein the second aspect ratio is different than the first aspect ratio.

12. A method for forming a semiconductor structure associated with mitigating pattern collapse, comprising:
    etching a first trench within a first dielectric region;
    forming a first metal line barrier within the first trench;
    forming a first metal line within the first trench over the first metal line barrier;
    forming a second dielectric region above at least one of the first metal line or the first dielectric region;
    etching a second trench within the second dielectric region, wherein a bottom of the second trench is laterally offset from a top of the first trench;
    forming a second metal line barrier within the second trench;

etching the second metal line barrier to expose a portion of the first metal line and a portion of the first metal line barrier; and forming a second metal line within the second trench after the etching the second metal line barrier.

13. The method of claim 12, wherein the etching a second trench comprises:

etching the second trench to expose the portion of the first metal line and a portion of the first dielectric region.

14. The method of claim 12, wherein the forming a second metal line barrier comprises:

forming the second metal line barrier to overlie the first metal line and the first dielectric region.

15. The method of claim 12, wherein the forming a first metal line barrier comprises forming the first metal line barrier to contact the first dielectric region.

16. A method for forming a semiconductor structure associated with mitigating pattern collapse, comprising:

etching a first trench within a first dielectric region;

forming a first metal line barrier within the first trench to contact the first dielectric region;

forming a first metal line within the first trench over the first metal line barrier;

forming a second dielectric region above the first metal line;

etching a second trench within the second dielectric region;

forming a barrier layer within the second trench to contact the first metal line barrier and the first metal line; and etching the barrier layer to expose a portion of the first metal line and a portion of the first metal line barrier.

17. The method of claim 16, comprising, before the etching a first trench:

forming the first dielectric region above a first etch stop layer (ESL);

forming a cap region above the first dielectric region; and forming a hard mask (HM) region above the cap region.

18. The method of claim 17, comprising, after the forming a first metal line and before the forming a second dielectric region:

removing at least some of the cap region;

removing at least some of the HM region; and performing a first chemical mechanical planarization (CMP) on at least one of the first dielectric region or the first metal line.

19. The method of claim 16, wherein the etching a second trench comprises exposing a portion of the first dielectric region.

20. The method of claim 1, comprising:

before the forming a first metal line, forming a second metal line barrier within the first trench, wherein the removing a portion of the metal line barrier comprises exposing a portion of the first metal line barrier.

* * * * *